(12) United States Patent
Mitsui et al.

(10) Patent No.: US 7,443,139 B2
(45) Date of Patent: Oct. 28, 2008

(54) BATTERY STATE-OF-CHARGE ESTIMATOR

(75) Inventors: Masahiko Mitsui, Toyota (JP); Yoshiyuki Nakayama, Toyota (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 495 days.

(21) Appl. No.: 10/519,573

(22) PCT Filed: Jun. 25, 2003

(86) PCT No.: PCT/JP03/08029

§ 371 (c)(1), (2), (4) Date: Dec. 30, 2004

(87) PCT Pub. No.: WO2004/008166

PCT Pub. Date: Jan. 22, 2004

(65) Prior Publication Data

US 2005/0269991 A1 Dec. 8, 2005

(30) Foreign Application Priority Data

Jul. 12, 2002 (JP) .............................. 2002-204009
Apr. 17, 2003 (JP) .............................. 2003-112387

(51) Int. Cl.
*H02J 7/00* (2006.01)
(52) U.S. Cl. ..................... 320/134; 320/132; 324/427
(58) Field of Classification Search ................. 320/132, 320/134, 153; 324/427, 429
See application file for complete search history.

(56) References Cited

U.S. PATENT DOCUMENTS 5,656,920 A * 8/1997 Cherng et al. ............... 320/161

6,285,163 B1 * 9/2001 Watanabe et al. ............ 320/132
6,608,482 B2 * 8/2003 Sakai et al. .................. 324/426

FOREIGN PATENT DOCUMENTS

| JP | HEI 1-95679 | 6/1989 |
| JP | 7-283774 | 10/1995 |
| JP | 8-43504 | 2/1996 |
| JP | 8-146106 | 6/1996 |

(Continued)

*Primary Examiner*—Akm Enayet Ullah
*Assistant Examiner*—Aaron Piggush
(74) *Attorney, Agent, or Firm*—Kenyon & Kenyon LLP

(57) ABSTRACT

A battery ECU estimates the SOC by integrating the battery current measured by a current sensor, and the battery voltage $V_n$ is measured by a voltage sensor, and the battery temperature $T_n$ is measured by a thermometer if the fluctuation of the charging/discharging current is great. If the number m of estimations of $SOC_n$ is m≦10, m is incremented. The battery internal resistance $R_n$ is estimated from the measured battery temperature $T_n$ by using a correlation map showing the correlation between the previously stored battery temperature T and the battery internal resistance R. An estimation charging/discharging current $I_n$ is determined using the measured battery voltage $V_n$, the battery open voltage $V_{ocvn-1}$ determined on the basis of the previously estimated charged state, and the estimated battery internal resistance $R_n$. The $SOC_n$ is estimated by integrating the estimated charging/discharging current $I_n$. If the number m of estimations of the $SOC_n$ is m=10, the number m of estimations is changed to 0. The charging/discharging current $i_n$ is measured by a current sensor. The battery internal resistance $R_n$ is calculated from the battery voltage $V_n$ and the charging/discharging current $i_n$. The battery temperature $T_n$ is also measured, and the T-R correlation map is corrected

9 Claims, 15 Drawing Sheets

FOREIGN PATENT DOCUMENTS

| | | |
|---|---|---|
| JP | 9-257887 | 10/1997 |
| JP | 11-346444 | 12/1999 |
| JP | 2000-166105 | 6/2000 |
| JP | 2000-258513 | 9/2000 |
| JP | 2001-4724 | 1/2001 |
| JP | 2002-189066 | 7/2002 |

\* cited by examiner

BATTERY STATE-OF-CHARGE ESTIMATOR

This is a 371 national phase application of PCT/JP2003/008029 filled 25 Jun. 2003, claiming priority to Japanese Application Nos. 2002-204009filed 12 Jul. 2002, and 2003-112387 filed 17 Apr. 2003, the contents of which are incorporated herein by reference.

TECHNICAL FIELD

The present invention relates to a battery state-of-charge estimator which estimates the state of charge of a battery equipped to a vehicle.

BACKGROUND ART

Conventionally, a secondary cell (that is, a battery such as a nickel hydrogen battery or a lithium ion battery) for driving a motor in hybrid electric vehicles having a power generator for generating power by driving and regeneration by an engine and a motor which is operated with power from the battery for driving a driving wheel and in electric vehicles including the hybrid vehicles.

As an indication of a state of charge of the battery, a measure known as SOC (state of charge) is used, in which an SOC of 100% represents a fully charged state and an SOC of 0% represents a state in which the amount of charging is zero. In addition, there is a one-to-one correspondence between an open voltage Vocv and the SOC for a battery. Therefore, it is possible to calculate an SOC corresponding to an open voltage Vocv from a correlation between Vocv and SOC by measuring or estimating the open voltage Vocv of the battery.

Because the state of charge (SOC) of the battery changes depending on the running state of a vehicle (for example, starting, normal running, acceleration, deceleration, etc.) and electrical load of the vehicle (for example, brake lights, headlights, wipers, fan, etc.), the SOC must be estimated while the battery is being used. Conventionally, an SOC estimator in which the SOC is estimated by integrating a current (charging/discharging current) value of the battery is widely in use as an SOC estimator for the battery.

For example, Japanese Patent Laid-Open Publication No. 2000-166105 discloses a device as shown in FIGS. 14 and 15 in which, when a current sensor 16 for detecting a charging/discharging current of a battery 10 is normal (S400, S402), a charging/discharging current value detected by a battery ECU 34 is integrated to estimate the SOC (S404), and, when the current sensor 16 is abnormal, on the other hand, the state of charge of the battery is determined by the battery ECU 34 based on a battery voltage detected by a voltage detector 12 because the SOC cannot be detected through integration of charging/discharging current (S406, S407).

However, in the battery state-of-charge controller of Japanese Patent Laid-Open Publication No. 2000-166105, because the state of charge of the battery is determined based on the battery voltage from the voltage sensor when the current sensor is abnormal, the estimation precision of the determined SOC is low when the slope of the relationship between OCV and SOC changes.

In addition, there is a problem in that the estimation precision of the SOC is reduced in the SOC estimation unit through the integration method of the measured values in the current sensor when the measured current value is a value which contains an error or noise.

DISCLOSURE OF INVENTION

The present invention was conceived in view of the above-described problems, and an object of the present invention is to provide a battery state-of-charge estimator in which a precision of SOC estimation is improved even when the current value of the battery is a value containing an error or an abnormal value.

A battery state-of-charge estimator according to various aspects of the present invention has the following characteristics.

(1) According to one aspect of the present invention, there is provided a battery state-of-charge estimator comprising a voltage detector unit which detects a voltage of a battery, an internal resistance estimator unit which estimates an internal resistance of the battery, an estimated charging/discharging current calculator unit which calculates an estimated charging/discharging current of the battery based on the internal resistance of the battery determined by the internal resistance estimator unit, the voltage of the battery, and an open voltage of the battery, an SOC estimator unit which estimates a state of charge (hereinafter referred to as "SOC") of the battery based on the estimated charging/discharging current determined by the estimated charging/discharging current calculator unit, and an open voltage calculator unit which sets the measured voltage of the battery as the open voltage of the battery at an initial calculation of the charging/discharging current and calculates the open voltage of the battery based on the SOC which is previously estimated after the initial calculation.

The battery state-of-charge estimator according to this aspect of the present invention does not estimate the SOC by integrating a measured current value detected by a current detector unit, but rather estimates the internal resistance of the battery, determines an estimated charging/discharging current of the battery using the estimated internal resistance of the battery, the battery voltage, and the open voltage of the battery calculated based on the SOC which is previously estimated, and estimates the state of charge of the battery based on the estimated charging/discharging current. Because of this structure, even when the measured current value detected by the current detector unit is a value containing an error or an abnormal value, it is possible to precisely estimate the state of charge of the battery.

(2) According to another aspect of the present invention, there is provided a battery state-of-charge estimator comprising a voltage detector unit which detects a voltage of a battery, an internal resistance estimator unit which estimates an internal resistance of the battery from a state of the battery, an estimated charging/discharging current calculator unit which calculates an estimated charging/discharging current of the battery based on the internal resistance of the battery determined by the internal resistance estimator unit, the voltage of the battery, and an open voltage of the battery, a first SOC estimator unit which estimates a state of charge of the battery based on the estimated charging/discharging current determined by the estimated charging/discharging current calculator unit, and an open voltage calculator unit which sets the measured voltage of the battery as the open voltage of the battery at an initial calculation of the charging/discharging current and calculates the open voltage of the battery based on the SOC which is previously estimated, after the initial calculation.

In the battery state-of-charge estimator according to this aspect of the present invention, the measured current value detected by the current detector unit is not used, but instead an internal resistance of a battery is estimated from a state of the battery, an estimated charging/discharging current of the battery is determined using the estimated internal resistance of the battery, the battery voltage, and the open voltage of the battery calculated based on the SOC which is previously estimated, and the state of charge of the battery is estimated based on the estimated charging/discharging current. Because of this structure, the state of charge of the battery can be precisely estimated without being affected by a measured current value even when the measured current value detected by the current detector unit is a value containing an error or an abnormal value. In addition, because the structure does not have a current detector unit which is expensive, it is possible to reduce the cost of the battery state-of-charge estimator.

(3) According to another aspect of the present invention, it is preferable that the battery state-of-charge estimator described above further comprises a temperature detector unit which detects a temperature of the battery, wherein the internal resistance estimator unit estimates the internal resistance based on the temperature of the battery.

Because there is a correlation between the temperature of the battery and the internal resistance of the battery, it is possible to easily calculate the internal resistance of the battery from the temperature of the battery by, for example, measuring the temperature and the internal resistance of the battery in advance and storing a correlation map.

(4) According to another aspect of the present invention, it is preferable that a battery state-of-charge estimator as described above further comprises a current detector unit which detects a charging/discharging current of the battery, an internal resistance calculator unit which calculates the internal resistance of the battery based on the measured charging/discharging current of the battery which is detected by the current detector unit and the voltage of the battery which is detected by the voltage detector unit, and an internal resistance corrector unit which intermittently corrects the estimated internal resistance which is estimated by the internal resistance estimator unit based on the internal resistance determined by the internal resistance calculator unit.

When, for example, the SOC is to be estimated for a battery in which the internal resistance of the battery changed as time elapses, it is possible to inhibit an increase in error of the estimated SOC due to deterioration of battery as time elapses and to precisely estimate the SOC by, for example, calculating the internal resistance of the battery from the charging/discharging current of the battery and the voltage of the battery and periodically correcting the estimated internal resistance based on the calculated internal resistance.

(5) According to another aspect of the present invention, it is referable that, in a battery state-of-charge estimator described above, the internal resistance corrector unit corrects a relationship between the estimated internal resistance and the temperature of the battery based on the internal resistance which is determined by the internal resistance calculator unit and the measured battery temperature.

With this structure, even when the internal resistance corresponding to the temperature of the battery changes as time elapses, for example, it is possible to periodically correct and update the correlation relationship between the temperature of the battery and the internal resistance of the battery, to thereby improve the estimation precision of the SOC of the battery as time elapses.

(6) According to another aspect of the present invention, there is provided a battery state-of-charge estimator comprising a current detector unit which detects a charging/discharging current of a battery, a voltage detector unit which detects a voltage of the battery, an internal resistance calculator unit which calculates an internal resistance of the battery based on the measured charging/discharging current of the battery which is detected by the current detector unit and the voltage of the battery which is detected by the voltage detector unit, an estimated charging/discharging current calculator unit which calculates an estimated charging/discharging current of the battery based on the internal resistance of the battery which is determined by the internal resistance calculator unit, the voltage of the battery, and an open voltage of the battery, a second SOC estimator unit which estimates a state of charge of the battery based on the estimated charging/discharging current which is determined by the estimated charging/discharging current calculator unit, and an open voltage calculator unit which sets the measured voltage of the battery as the open voltage of the battery at an initial calculation of the charging/discharging current and calculates the open voltage of the battery based on the SOC which is previously estimated, after the initial calculation.

According to this aspect of the present invention, the measured charging/discharging current detected by the current detector unit is hot directly integrated, but instead, the internal resistance of the battery is calculated based on the detected measured charging/discharging current and the measured voltage, the estimated charging/discharging current of the battery is calculated based on the calculated internal resistance of the battery, the measured voltage of the battery, and the open voltage of the battery, and the SOC is estimated by integrating the estimated charging/discharging current. Because of this configuration, even when the measured charging/discharging current detected by the current detector unit contains an error, it is possible to inhibit degradation of the precision of the estimated SOC. Moreover, when the SOC is to be estimated for a battery in which the internal resistance of the battery changes as time elapses, because the internal resistance of the battery is calculated from the measured charging/discharging current of the battery and the measured voltage of the battery, it is possible to inhibit an increase in error of the estimated SOC due to deterioration of the battery as time elapses. Thus, with this configuration, it is possible to precisely estimate the SOC.

(7) According to another aspect of the present invention, there is provided a battery state-of-charge estimator comprising a current detector unit which detects a charging/discharging current of a battery, a voltage detector unit which detects a voltage of the battery, an internal resistance estimator unit which estimates an internal resistance of the battery from a state of the battery, a first estimated charging/discharging current calculator unit which calculates an estimated charging/discharging current of the battery based on the internal resistance of the battery which is determined by the internal resistance estimator unit, the voltage of the battery, and an open voltage of the battery, a first SOC estimator unit which estimates a state of charge of the battery based on the estimated charging/discharging current which is determined by the first estimated charging/discharging current calculator unit, an internal resistance calculator unit which calculates an internal resistance of the battery based on the measured charging/discharging current of the battery which is detected by the current detector unit and the voltage of the battery which is detected by the voltage detector unit, a second estimated charging/discharging current calculator unit which calculates an estimated charging/discharging current of the battery based on the internal resistance of the battery which is determined by the internal resistance calculator unit, the voltage of the battery, and the open voltage of the battery, a second SOC estimator unit which estimates a state of charge of the battery based on the estimated charging/discharging current which is determined by the second estimated charging/discharging current calculator unit, a switching unit which switches between the SOC from the first SOC estimator unit and the SOC from the second SOC estimator unit based on the state of the battery, and an open voltage calculator unit which sets the measured voltage of the battery as the open voltage of the battery at an initial calculation of the charging/discharging current and calculates the open voltage of the battery based on the SOC which is previously estimated, after the initial calculation.

In this aspect of the present invention, because the first SOC estimator unit and the second SOC estimator unit are switched, it is possible to precisely estimate the SOC even when the measured charging/discharging current detected by the current detector unit contains an error or has an abnormal value.

(8) According to another aspect of the present invention, it is preferable that a battery state-of-charge estimator as described above further comprises an abnormality detector unit which compares the measured charging/discharging current value detected by the current detector unit and the estimated charging/discharging current value calculated by the estimated charging/discharging current calculator unit, and determines that the current detector unit is abnormal when a difference between the charging/discharging current values is greater than a predetermined difference and that the current detector unit is normal when the difference is a predetermined difference or smaller, wherein the switching unit switches to the SOC from the first SOC estimator unit when the abnormality detector unit determines that the current detector unit is abnormal and switches to the SOC from the second SOC estimator unit when the abnormality detector unit determines that the current detector unit is normal.

Because the determination of whether or not the measured charging/discharging current value is to be used in calculation of the estimated charging/discharging current is effected by determining, in the abnormality detector unit, whether or not the current detector unit is abnormal and then one of the first and second SOC estimator units is selected, it is possible to more precisely estimate the SOC.

(9) According to another aspect of the present invention, it is preferable that, in a battery state-of-charge estimator as described above, the temperature detector unit is placed in the battery, on a surface of the battery, or near the surface of the battery.

In general, the temperature of the battery changes with a change in the internal resistance of the battery. Therefore, by providing a temperature detector unit near the surface of the battery, on the surface of the battery, or in the battery, it is possible to detect a battery temperature which is highly correlated to the internal resistance of the battery. As a result, the precision of the estimated SOC is improved.

(10) According to another aspect of the present invention, it is preferable that, in a battery state-of-charge estimator as described above, at least one of the first SOC estimator unit, the second SOC estimator unit, and the SOC estimator unit periodically estimates the SOC at a predetermined interval.

Because the SOC is periodically estimated at a predetermined interval, it is possible to know more recent state of charge of the battery.

(11) According to another aspect of the present invention, it is preferable that a battery state-of-charge estimator as described above further comprises a current detector unit which detects a charging/discharging current of the battery, a first battery full-capacity calculator unit which determines a full capacity of the battery based on the SOC which is estimated by the SOC estimator unit or the first SOC estimator unit and an integrated value of the charging/discharging current of the battery which is detected by the current detector unit during the estimation of the SOC, and a third SOC estimator unit which estimates a state of charge of the battery based on the full capacity of the battery which is obtained by the first battery full-capacity calculator unit and the measured charging/discharging current of the battery which is detected by the current detector unit.

In general, when the SOC is to be estimated based on the estimated charging/discharging current of the battery obtained through calculation using the measured voltage value of the battery, it is possible to estimate the correct SOC because the relationship between the SOC and the open voltage does not change even with the change of the capacity due to deterioration of the battery. However, when a polarization voltage of the battery and its small variation are not considered when the open voltage is calculated, the precision of the estimated charging/discharging current value of the battery is slightly reduced because of the polarization voltage and its variation and, therefore, a highly precise estimation is sometimes not possible. On the other hand, when the SOC is to be estimated based on the measured current value of the battery as is done in the related art, a highly precise estimation is only possible when the initial SOC is accurate, the precision of the current detector unit is high, and the full capacity of the battery is always constant. Thus, even when the polarization voltage of the battery is not considered, it is possible to more precisely estimate the SOC by knowing the change in the full capacity of the battery caused by deterioration of the battery.

(12) According to another aspect of the present invention, it is preferable that a battery state-of-charge estimator as described above further comprises a second battery full-capacity calculator unit which determines a full capacity of the battery based on the SOC which is estimated by the first SOC estimator unit or the second SOC estimator unit and an integrated value of the charging/discharging current of the battery which is detected by the current detector unit during the estimation of the SOC, and a fourth SOC estimator unit which estimates a state of charge of the battery based on the full capacity of the battery which is obtained by the second battery full-capacity calculator unit and the measured charging/discharging current of the battery detected by the current detector unit.

Similar to the above-described aspect of the present invention, according to this aspect of the present invention, it is possible to consider a change in the full capacity of the battery caused by deterioration of the battery and to more precisely estimate the Soc.

(13) According to another aspect of the present invention, it is preferable that a battery state-of-charge estimator as described above further comprises a remaining capacity detector unit which detects a remaining capacity of each individual cell within the battery and a remaining energy calculator unit which detects a minimum remaining capacity based on the remaining capacity of each individual cell which is obtained from the remaining capacity detector unit and calculates an amount of remaining energy of the battery based on the minimum remaining capacity.

With a configuration according to this aspect of the present invention, even when the battery is deteriorated and the capacity changes, it is possible to know the minimum amount of remaining energy which can be extracted from the battery.

(14) According to another aspect of the present invention, it is preferable that, in a battery state-of-charge estimator as described above, the estimated charging/discharging current calculator unit, the first charging/discharging current calculator unit, or the second charging/discharging current calculator unit calculates the estimated charging/discharging current of the battery based on the internal resistance of the battery, the voltage of the battery, the open voltage of the battery, and a polarization voltage.

By considering the polarization voltage in the battery, it is possible to more precisely estimate the SOC. For example, when the battery is a lithium battery, the polarization may affect the estimation of the SOC, and, thus, calculation of the estimated charging/discharging current of the battery as described is preferred, in particular for the lithium battery.

(15) According to another aspect of the present invention, it is preferable that a battery state-of-charge estimator as described above further comprises a current detection abnormality detector unit which compares the measured charging/discharging current value which is detected by the current detector unit which detects a charging/discharging current of the battery and the estimated charging/discharging current value which is determined by one of the estimated charging/discharging current calculator unit, the first charging/discharging current calculator unit, and the second charging/discharging current calculator unit, and determines that the current detector unit is abnormal when a difference between the current values is greater than a predetermined difference and that the current detector unit is normal when the difference is a predetermined value or smaller, wherein the SOC is estimated based on the estimated charging/discharging current value when the current detection abnormality detector unit determines that the current detector unit is abnormal and the SOC is estimated using the measured charging/discharging current value when the current detection abnormality detector unit determines that the current detector unit is normal.

By using the current detection abnormality detector unit, it is possible to determine the precision of the current detector unit and to more precisely estimate the SOC using a more accurate charging/discharging current value.

(16) According to another aspect of the present invention, it is preferable that, in a battery state-of-charge estimator as described above, depending on an environmental temperature of the battery, one of the measured charging/discharging current value which is detected by the current detector unit which detects the charging/discharging current of the battery and the estimated charging/discharging current value which is determined by one of the estimated charging/discharging current calculator unit, the first charging/discharging current calculator unit, and the second charging/discharging current calculator unit is selected, and the SOC is estimated based on the selected charging/discharging current value.

Depending on the temperature range of the environmental temperature of the battery, there may be a case in which the detection precision of the current detector unit is high and the precision of the measured charging/discharging current value is high and a case in which the precision of the estimated charging/discharging current value is high. Therefore, by estimating the SOC based on the charging/discharging current value with a higher precision, it is possible to more precisely estimate the SOC.

(17) According to another aspect of the present invention, it is preferable that a battery state-of-charge estimator as described above further comprises a charging/discharging prohibiting unit which prohibits charging and discharging of the battery when the charging/discharging current of the battery considering the polarization voltage exceeds a predetermined value.

The charging/discharging current value of the battery considering the polarization voltage can be precisely obtained in a range which is wider than a normal usage range (for example, −120 A~120 A) of the current detector unit such as a current sensor, and, therefore, it is effective to use the charging/discharging current value of the battery considering the polarization voltage for determination of the establishment of prohibition condition of the charging and discharging of the battery.

(18) According to another aspect of the present invention, it is preferable that, in a battery state-of-charge estimator as described above, the temperature detector unit is placed in the battery, on the surface of the battery, or near the surface of the battery.

As described, by detecting the battery temperature, which has a high correlation to the internal resistance of the battery, the precision of the estimated SOC can be improved.

(19) According to another aspect of the present invention, it is preferable that, in a battery state-of-charge estimator as described above, at least one of the first SOC estimator unit, the second SOC estimator unit, and the SOC estimator unit periodically estimates the SOC at a predetermined interval.

By periodically estimating the SOC at a predetermined interval, it is possible to know a more recent state of charge of the battery.

BEST MODE FOR CARRYING OUT THE INVENTION

Figure 1:
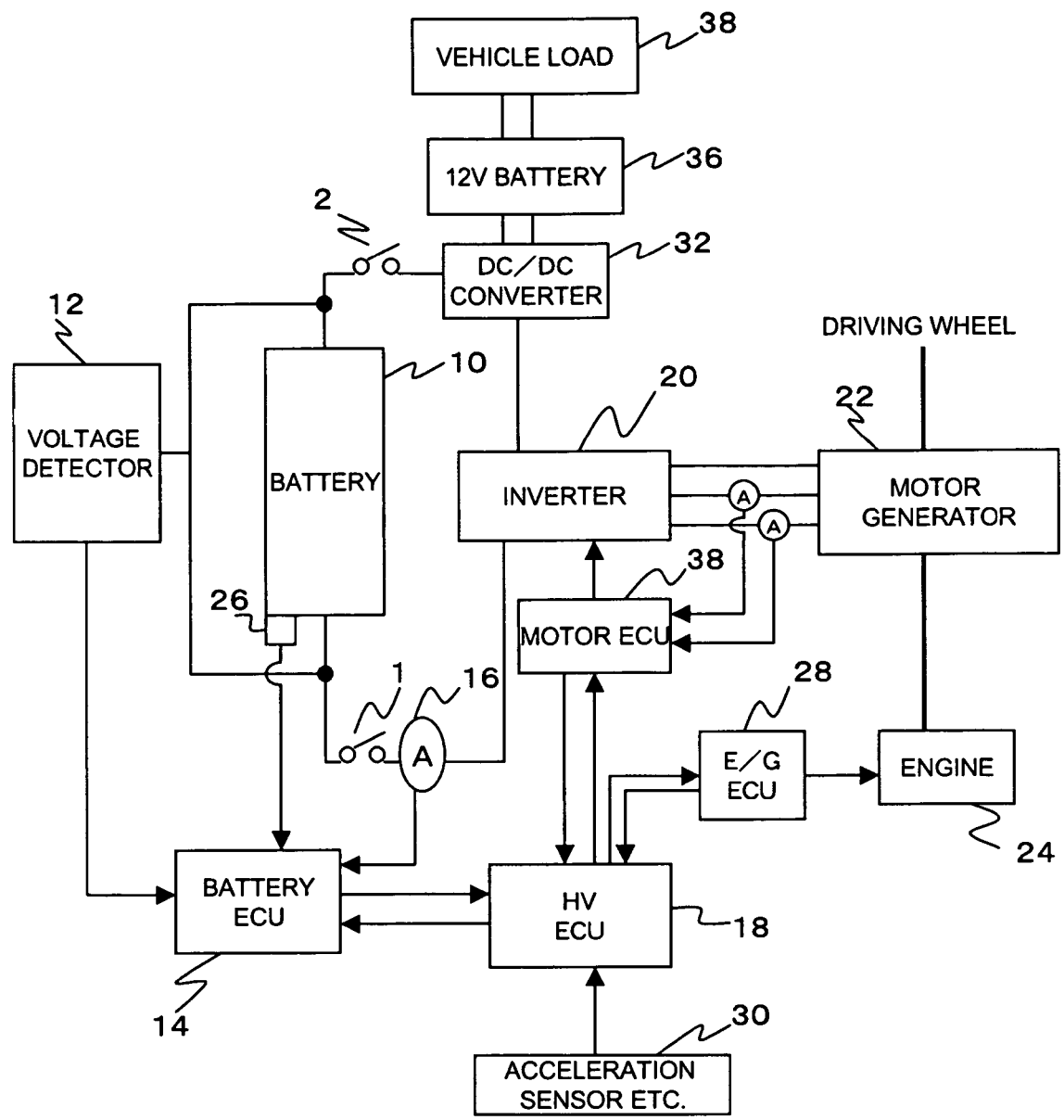
FIG. 1 is a block diagram showing a structure of a system in which a battery state-of-charge estimator according to a first preferred embodiment or a second preferred embodiment of the present invention is applied to a hybrid electric vehicle.

Preferred embodiments of the present invention will now be described referring to the drawings.

First Preferred Embodiment

<First Example Device Having a Current Detector Unit>

[Structure of a Battery State-of-Charge Estimator]

FIG. 1 is a block diagram showing a structure of a system in which a battery state-of-charge estimator according to a first preferred embodiment of the present invention is applied to a hybrid electric vehicle. A battery 10 is a battery pack in which a plurality of battery cells are connected in series and comprises, for example, cells of nickel hydrogen (Ni-MH) batteries and lithium ionbatteries.

A voltage of the battery 10 is measured by a voltage detector 12 which is a voltage detector unit and the measured voltage is supplied to a battery ECU 14. A current sensor 16 which is a current detector unit for detecting a current of the battery is also connected to the battery ECU 14 such that the detected battery current value is supplied to the battery ECU 14. A thermometer 26 for detecting a temperature of the battery is provided for the battery 10 and a value of the detected battery temperature is also supplied to the battery ECU 14. Here, the thermometer 26 is placed in the battery 10, on a surface of the battery 10, or near the surface of the battery 10. In addition, a relay 1 for measuring an open voltage is provided between the battery 10 and the current sensor 16. Similarly, a relay 2 for measuring an open voltage is provided between the battery 10 and a DC/DC converter 32. A vehicle load 38 is connected to the DC/DC converter 32 via a 12V battery 36. Examples of a vehicle load 38 include, for example, the requirements of a break light, an electrically-driven fan, a blower, a headlight, a fog lamp, a defogger, a wiper, or the like. An HVECU 18 receives a signal from an accessory sensor or the like 18, outputs an output instruction for engine to an E/GECU 28 which controls output of an engine 24 or the like, and receives engine output control information from the E/GECU 28. In addition, the HVECU 18 outputs a torque instruction or the like to a motor ECU 38 and receives an input of motor control information from the motor ECU 38. The motor ECU 38 also controls a switching operation at an inverter 20. In this manner, an input to a motor generator 22 is determined and a driving wheel can be driven according to the output. In the present embodiment, a structure is described with one voltage detector unit, one current detector unit, and one thermometer, but the numbers of the respective components are not thus limited, and a plurality of voltage detector units, current detector units, or thermometers may be provided at a plurality of locations in order to improve detection precision, such as, for example, one component in each cell. The current sensor 16 employed as the current detector unit of FIG. 1 may be, for example, a current sensor which magnetically detects the current.

The battery ECU 14 uses both the supplied battery voltage and the supplied battery current and has at least one of first, second, third, and fourth SOC detector units as described below. The battery ECU 14 supplies the SOC detected in one of the SOC detector units to the HVECU 18.

The HVECU 18 determines a torque instruction based on information such as, for example, the acceleration, the level of brake pressure, and the vehicle speed and controls the output of the motor generator 22 such that the output matches the torque instruction. In other words, the HVECU 18 controls switching at the inverter 20 and, at the same time, controls the output of the engine 24. With this configuration, an input to the motor generator 22 is determined and the output of the motor generator 22 is controlled to match the torque instruction.

The battery 10 is charged or discharged based on, for example, a running state of the vehicle (for example, starting, normal running, acceleration, deceleration, etc.), vehicle load (for example, the load of a brake light, headlight, wiper, fan, or the like), and the state of charge of the battery.

[Estimation of State of Charge of Battery]

Figure 2:
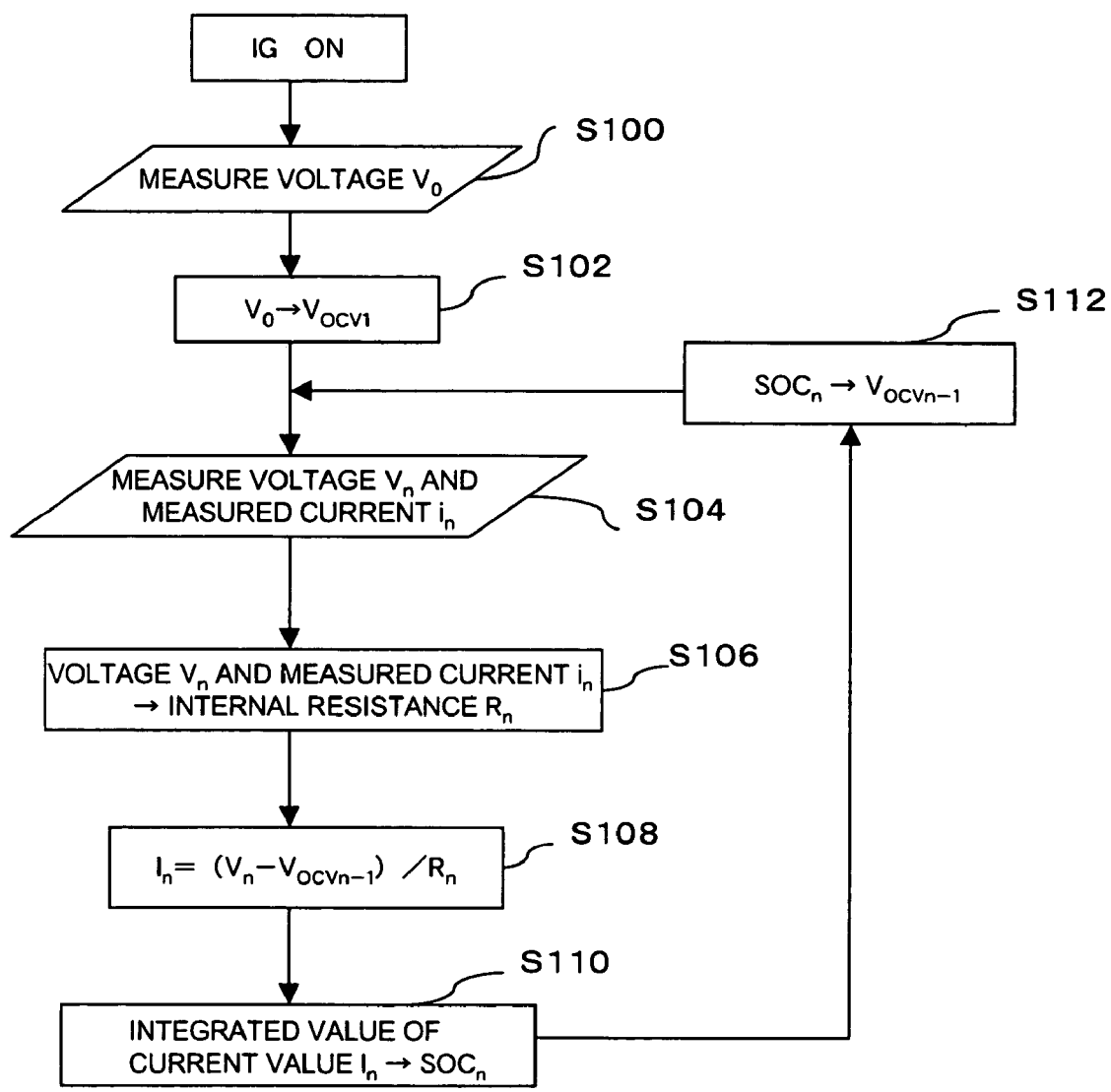
FIG. 2 is a flowchart for explaining an operation of a second SOC estimator unit according to a first preferred embodiment of the present invention.

Next, an example operation of a second SOC estimator unit according to the present invention will be described referring to FIG. 2. In example of the present embodiment, a solution is provided for a problem resulting from erroneous integration when a measured charging/discharging current value measured by the current sensor 16 contains an error.

When IG is switched ON, the voltage detector 12 measures an initial battery voltage $V_0$ before the relays 1 and 2 are switched on (S100). Then, the initial battery voltage $V_0$ is set as an open voltage $V_{ocv1}$ (S102). The voltage detector 12 measures a present battery voltage $V_n$ (n is 1~n and does not include 0; this applies similarly in the following descriptions) under a loaded state after the relays 1 and 2 are switched on and the current sensor 16 measures a present battery charging/discharging current $i_n$ under a loaded state after the relays 1 and 2 are switched on (S104). An internal resistance $R_n$ of the battery is determined based on the battery voltage $V_n$ and the measured battery current $i_n$ (S106). Next, an estimated charging/discharging current $I_n$ is determined based on the measured battery voltage $V_n$, an open voltage $V_{ocvn-1}$ of the battery determined based on the state of charge (SOC) which is previously estimated, and the battery internal resistance $R_n$ determined through calculation (S108). In S108, at an initial calculation of the estimated charging/discharging current $I_n$, the measured voltage $V_0$ of the battery is used as the opening voltage $V_{ocvn-1}$ of the battery. Then, the estimated charging/discharging current $I_n$ is integrated to estimate $SOC_n$ (S110). Using a correlation map between the SOC and the open voltage $V_{ocv}$ which is stored in advance, $V_{ocvn-1}$ is calculated based on the calculated $SOC_n$ (S112) and the next SOC is estimated based on the $V_{ocvn-1}$.

Figure 3:
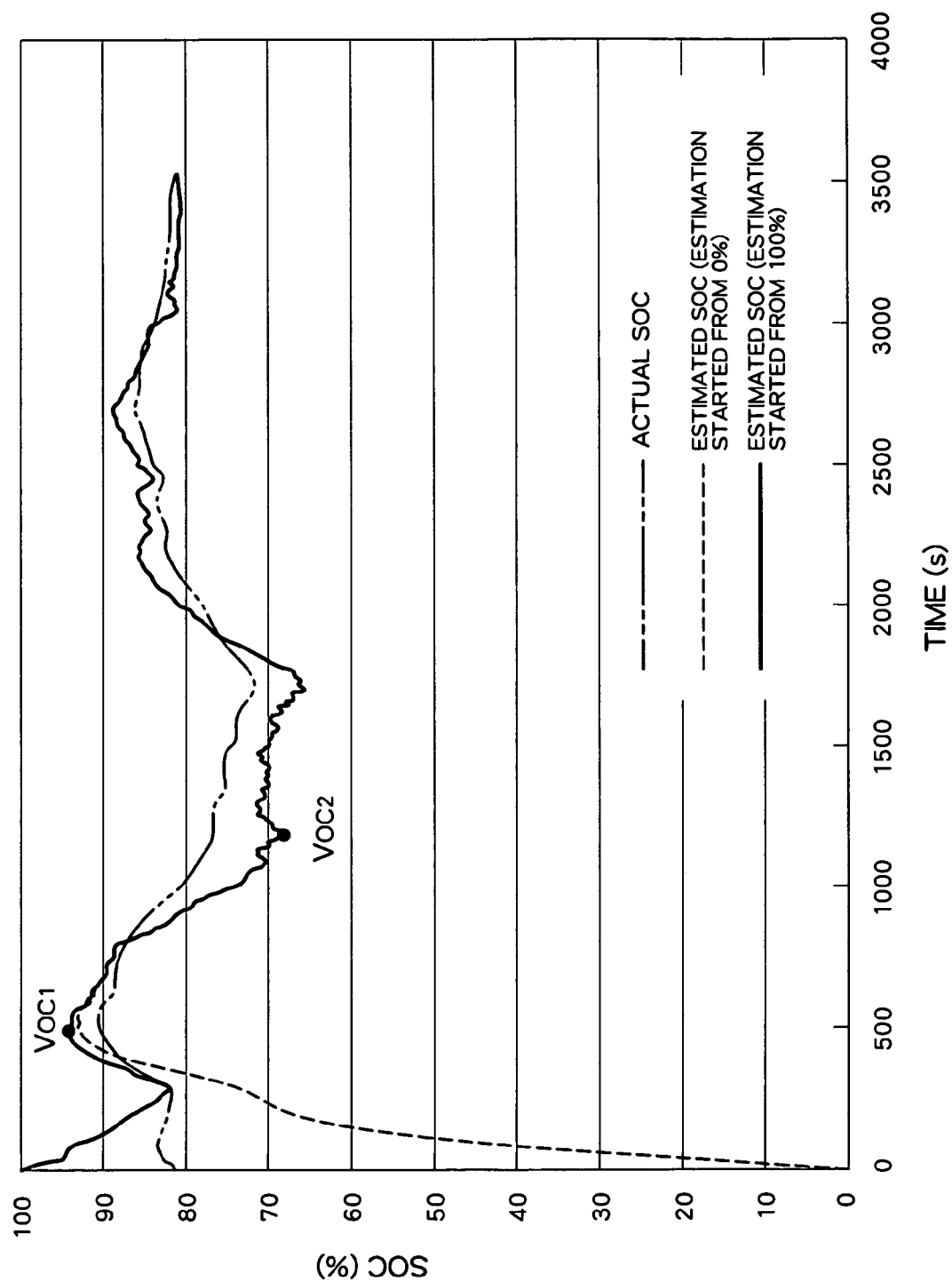
FIG. 3 is a diagram for explaining self-convergence of an estimated SOC of a battery which is estimated by a second SOC estimator unit according to a first preferred embodiment of the present invention and the actual SOC of the battery.

As shown in FIG. 3, with the second SOC estimator unit of the first preferred embodiment of the present invention as described above, the estimated SOC which is estimated through integration of estimated charging/discharging current value converges to the actual SOC, and therefore, an estimation precision of the state of charge (SOC) of the battery can be improved. In other words, the following equation (1) is satisfied:

$$\text{Current } I = (V_m - V_{ocv})/R \tag{1}$$

wherein $V_m$ represents the measured voltage, R represents the internal resistance, and $V_{ocv}$ represents the open voltage.

When the real current value is represented by $I_{real}$, the following equation (2) is satisfied:

$$\text{Real current value } I_{real} = (V_m - V_{ocv\text{-}real})/R \tag{2}$$

When the estimated $V_{ocv}$ is greater than $V_{ocv\text{-}real}$, that is, when $V_{ocv\text{-}real} < V_{ocv1}$, the following equation (3) is satisfied:

$$(V_m - V_{ocv1})/R = I_1 < I_{real} \tag{3}$$

When, on the other hand, the estimated $V_{ocv}$ is smaller than $V_{ocv\text{-}real}$, that is, when $V_{ocv\text{-}real} > V_{ocv2}$, the following equation (4) is satisfied:

$$(V_m - V_{ocv2})/R = I_2 > I_{real} \tag{4}$$

Thus, as shown in FIG. 3, it can be concluded that, when the estimated SOC is greater than the actual SOC, the charging/discharging current value $I_1$ is always estimated smaller than the actual current value $I_{real}$ and that, when the estimated SOC is smaller than the actual SOC, the current value $I_2$ is always estimated to be greater than the actual current value $I_{real}$. Therefore, the estimated SOC self-converges to the actual SOC as time elapses and, consequently, the precision of SOC estimation of the SOC estimator according to the present invention is improved.

Therefore, even when the measured charging/discharging current value of the current sensor 16 contains an error, degradation of the precision of the estimated SOC can be inhibited.

Second Preferred Embodiment

<Second Example Device Having a Current Detector Unit>

[Structure of Battery State-of-Charge Estimator]

A battery state-of-charge estimator according to the second preferred embodiment has a structure identical to that in the first preferred embodiment of the present invention described above, and the elements identical to those in the first preferred embodiment will be assigned the same reference numerals and will not be described again.

[Estimation of State of Charge of Battery]

Figure 4:
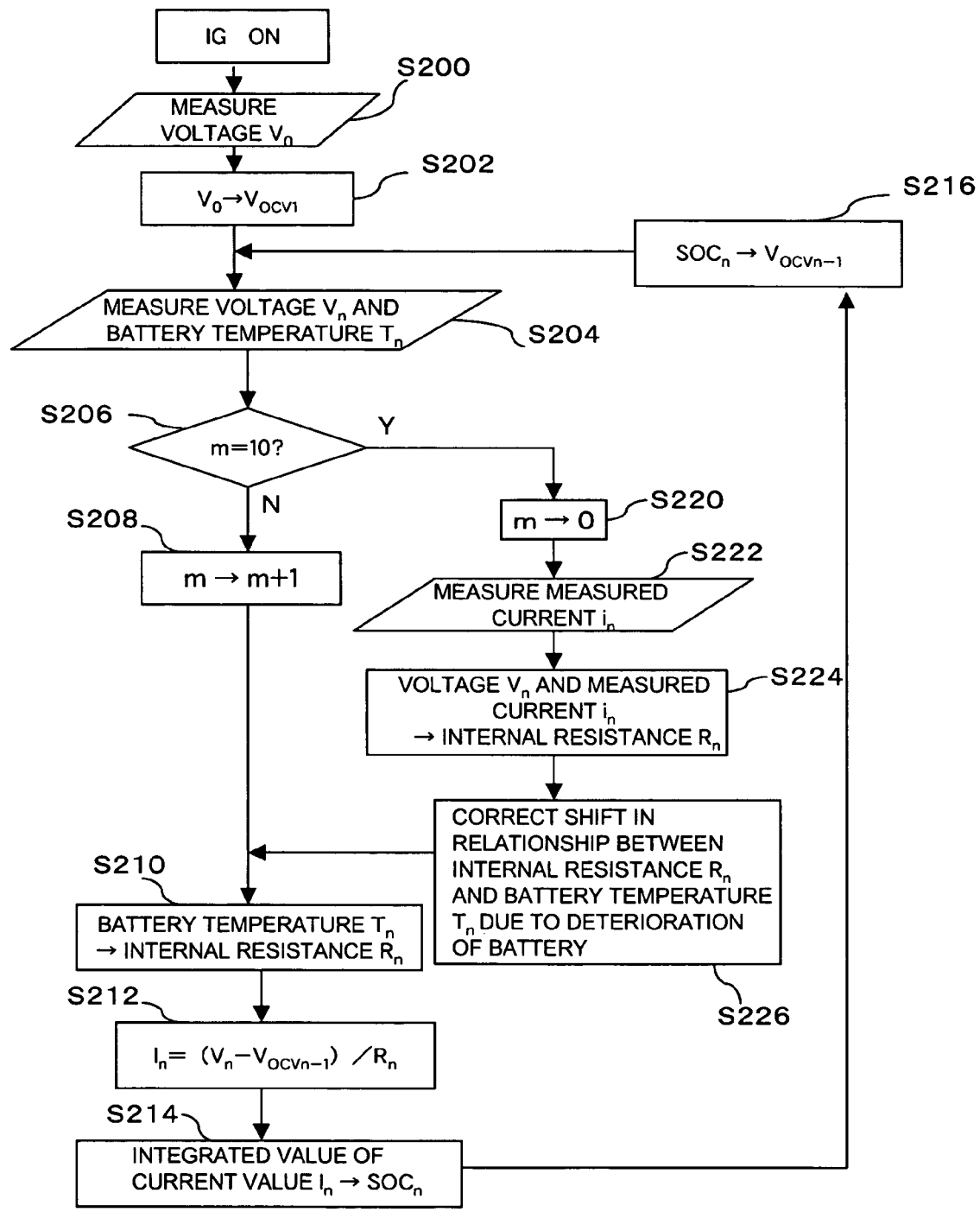
FIG. 4 is a flowchart for explaining an example operation of a first SOC estimator unit according to a second preferred embodiment of the present invention.

An example first SOC estimator unit according to the present invention is operated as shown in FIG. 4 in the battery ECU 14 shown in FIG. 1.

When IG is switched ON, the voltage detector 12 measures an initial battery voltage $V_0$ before the relays 1 and 2 are switched on (S200). Then, the initial battery voltage $V_0$ is set as an open voltage $V_{ocv1}$ (S202). The voltage detector 12 measures a present battery voltage $V_n$ (n is 1~n and does not include 0; similarly in the following description) under a loaded state after the relays 1 and 2 are switched on and the thermometer 26 measures a present battery temperature $T_n$ (S204). It is determined whether or not an estimation operation m of the $SOC_n$ to be described below has been performed for 10 times (S206). When the number m of estimation operations is less than 10, the number m of estimation operations is incremented by 1 (S208) and an internal resistance $R_n$ of the battery is estimated from the measured battery temperature $T_n$ using a correlation map between the battery temperature T and the internal resistance R of the battery which is stored in advance (S210). An estimated charging/discharging current $I_n$ is calculated using the measured battery voltage $V_n$, an open voltage $V_{ocvn-1}$ of the battery which is determined based on the state of charge (SOC) which is previously estimated, and the estimated internal resistance $R_n$ of the battery (S212). In S212, at an initial calculation of the estimated charging/discharging current $I_n$, the measured voltage $V_0$ of the battery is used as the open voltage $V_{ocvn-1}$ of the battery. Then, the estimated charging/discharging current $I_n$ is integrated to estimate $SOC_n$ (S214). Using a correlation map between the SOC and the open voltage $V_{ocv}$ which is stored in advance, $V_{ocvn-1}$ is calculated based on the determined $SOC_n$ (S216) and the next SOC is estimated based on the $V_{ocvn-1}$.

When, on the other hand, the number m of estimation operations of $SOC_n$ reaches 10 (S206), the number m of estimation operations is reset to 0 (S220) and the current sensor 16 measures a charging/discharging current $i_n$ (S222). Then, the internal resistance $R_n$ of the battery is calculated from the battery voltage $V_n$ and the measured charging/discharging current $i_n$ (S224) and the battery temperature $T_n$ at this time is measured. The correlation map between the battery temperature T and the internal resistance R of the battery which is stored in advance as described above is corrected in order to correct a deviation in the relationship between the internal resistance R and the dissociation temperature T due to, for example, deterioration of the battery (S226). The step S210 and steps following the step S210 are performed based on the corrected and updated T-R correlation map corrected based on the correction. In general, the charging/discharging current $i_n$ which is instantaneously measured by the current sensor 16 is correct, and therefore, it is possible to maintain precision of the estimated SOC as described below by applying a correction using the measured charging/discharging current $i_n$.

The sequence of operations from S204 to S216 in FIG. 4 is normally performed in 8 milliseconds, but the time may be longer, such as, for example, approximately 1 second.

With the first SOC estimator unit as described, because the internal resistance of the battery is estimated basically without using the charging/discharging current from the current sensor 16, even when the measured charging/discharging current value measured by the current sensor 16 contains an error or is an abnormal value, it is possible to highly precisely estimate the state of charge of the battery without being affected by the measured charging/discharging current value. In addition, by periodically correcting the estimated internal resistance based on the calculated internal resistance, it is possible to inhibit an increase in the error of the estimated SOC due to deterioration of the battery as time elapses.

Third Preferred Embodiment

<Third Example Device which does not Use a Current Detector Unit>

[Structure of the Battery State-of-Charge Estimator]

A battery state-of-charge estimator according to the present embodiment has a structure identical to that of the first and second preferred embodiments described above except that the battery state-of-charge estimator according to the present embodiment does not have a current sensor 16. The elements identical to those in the first and second preferred embodiments are assigned the same reference numerals and will not be described again.

[Estimation of State of Charge of the Battery]

Figure 5:
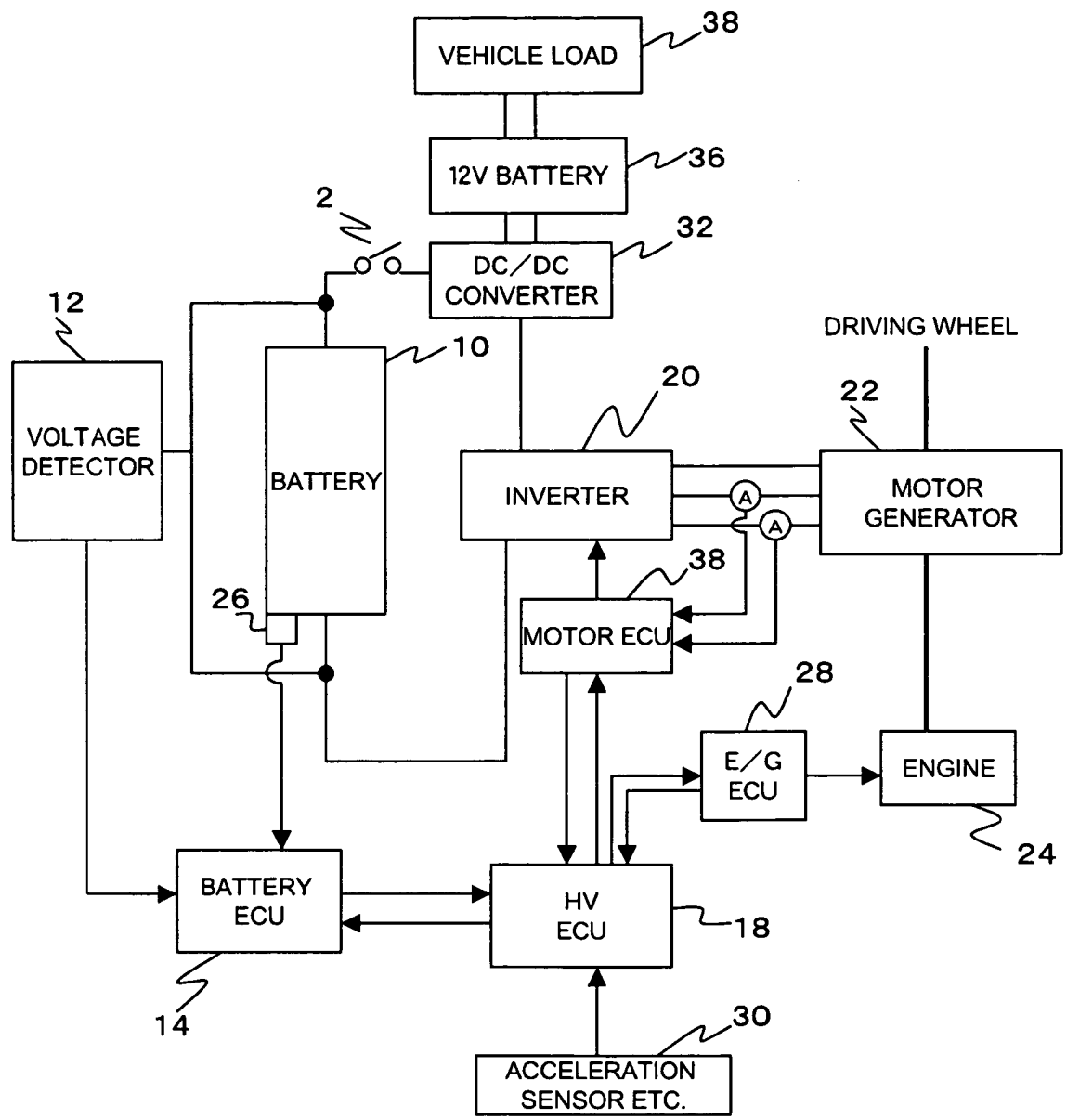
FIG. 5 is a block diagram showing a structure of a system in which the battery state-of-charge estimator according to a third preferred embodiment of the present invention is applied to a hybrid electric vehicle.

An operation of another example first SOC estimator unit according to the present invention in a battery ECU 14 as shown in FIG. 5 will now be described referring to FIG. 6.

When IG is switched ON, the voltage detector 12 measures an initial battery voltage $V_0$ before the relay 2 is switched on (S300). Then, the initial battery voltage $V_0$ is set as an open voltage $V_{ocv1}$ (S302). The voltage detector 12 measures a present battery voltage $V_n$ (n is 1~n and does not include 0; similarly in the following description) under a loaded state after the relay 2 is switched on and the thermometer 26 measures a present battery temperature $T_n$ (S304). Then, an internal resistance $R_n$ of the battery is estimated based on the measured battery temperature $T_n$ using a correlation map between the battery temperature T and the internal resistance R of the battery which is stored in advance (S306). An estimated charging/discharging current $I_n$ is determined using the measured battery voltage $V_n$, an open voltage $V_{ocvn-1}$ of the battery which is determined based on the state of charge (SOC) which is previously estimated, and the estimated internal resistance $R_n$ of the battery (S308). In S308, at an initial calculation of the estimated charging/discharging current $I_n$, the measured voltage $V_0$ of the battery is used as the open voltage $V_{ocvn-1}$ of the battery. Then, the estimated charging/discharging current $I_n$ is integrated to estimate $SOC_n$ (S310). Using a correlation map between the SOC and the open voltage $V_{ocv}$ which is stored in advance, $V_{ocvn-1}$ is calculated based on the determined $SOC_n$ (S312) and the next SOC is estimated based on the $V_{ocvn-1}$.

Because the above-described first SOC estimator unit estimates the SOC without using the current sensor 16, it is possible to precisely estimate the SOC regardless of the output of the current sensor 16 even in an environment in which the output of the current sensor 16 contains noise. In addition, the present embodiment is preferable because the present embodiment does not have the current sensor which is expensive and the cost of the device can be reduced in cases in which the internal resistance of the battery and the battery temperature does not significantly change as time elapses. The present embodiment is also preferable, for example, in cases in which a plurality of correlation maps between the internal resistance of the battery and the battery temperature are stored in advance corresponding to the elapse of time. As described regarding the second preferred embodiment of the present invention, it is also possible to continuously correct the correlation map between the internal resistance of the battery and the temperature of the battery by calculating the internal resistance of the battery using the measured charging/discharging current $i_n$, measuring the battery temperature at that time, and correcting the correlation map using the calculated internal resistance of the battery and the measured battery temperature (that is, steps of S206-S210 and S220-S226 of FIG. 4).

Fourth Preferred Embodiment

<Fourth Example Device Having a Current Detector Unit>

Figure 7:
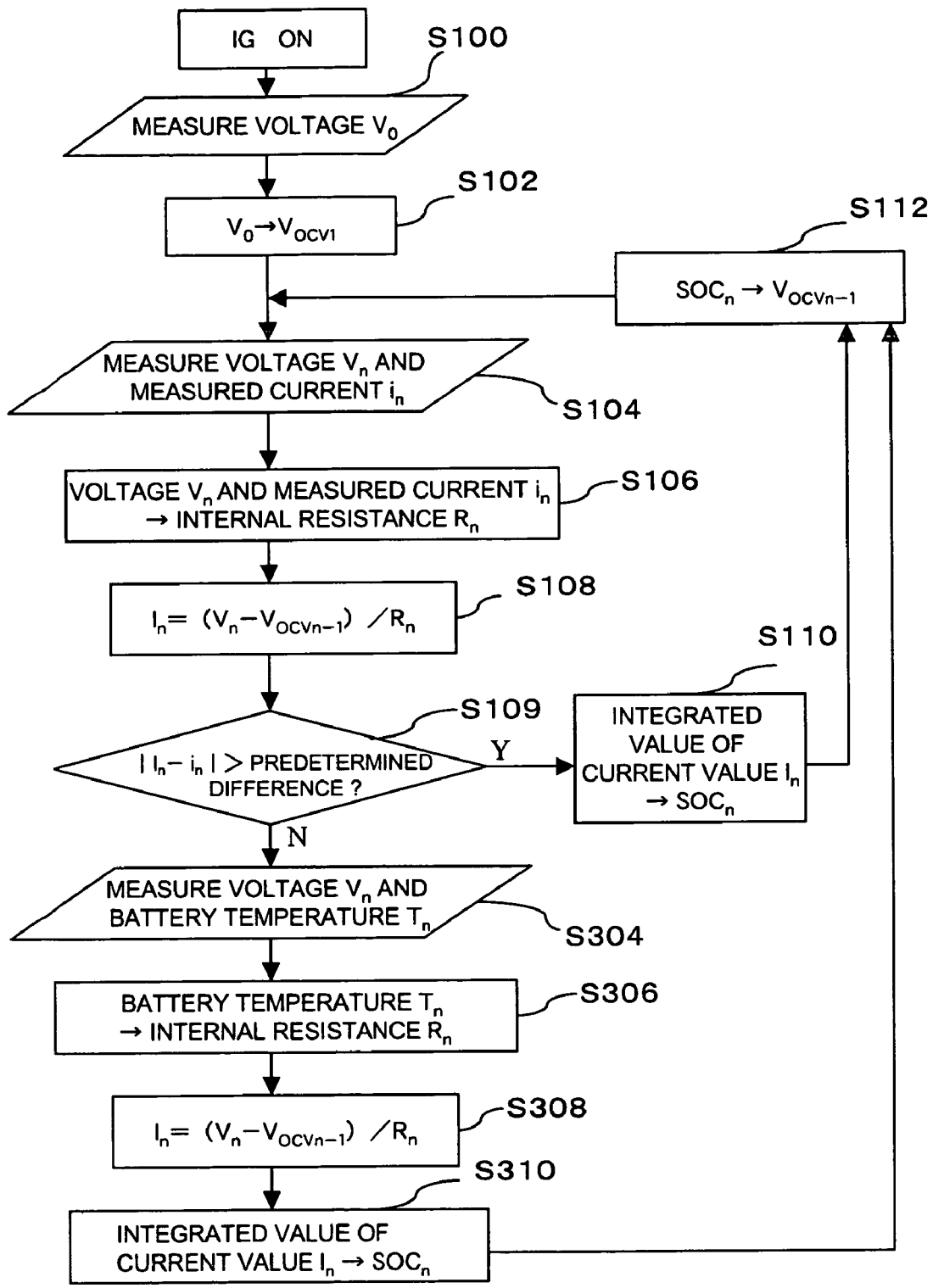
FIG. 7 is a flowchart for explaining a switching operation of a first SOC estimator unit and a second SOC estimator unit according to a fourth preferred embodiment of the present invention.

In another configuration of the present invention, it is possible to provide within the battery ECU 14 shown in FIG. 1 a current sensor abnormality determination device which compares the measured charging/discharging current $i_n$ detected by the current sensor 16 and the estimated charging/discharging current $I_n$ described below and determines the current sensor 16 to be abnormal when an absolute value of a difference between the charging/discharging currents $i_n$ and $I_n$ is greater than a predetermined difference and that the current sensor 16 is normal when the difference is a predetermined difference or smaller. In this configuration, a first SOC estimator unit and a second SOC estimator unit as shown in FIG. 7 are operated in a switching manner.

When IG is switched ON, the voltage detector 12 measures an initial battery voltage $V_0$ before the relays 1 and 2 are switched on (S100). Then, the initial battery voltage $V_0$ is set as an open voltage $V_{ocv1}$ (S102). The voltage detector 12 measures a present battery voltage $V_n$ (n is 1~n and does not include 0; similarly in the following description) under a loaded state after the relays 1 and 2 are switched on and the current sensor 16 measures a present battery charging/discharging current $i_n$ under a loaded state after the relays 1 and 2 are switched on (S104). Then, an internal resistance $R_n$ of the battery is calculated based on the battery voltage $V_n$ and the measured battery current $i_n$ (S106). An estimated charging/discharging current $I_n$ is calculated based on the measured battery voltage $V_n$, the open voltage $V_{ocvn-1}$ of the battery which is determined based on the state of charge (SOC) which is previously estimated, and the internal resistance $R_n$ of the battery which is obtained through calculation (S108). Then, the measured battery charging/discharging current $i_n$ and the estimated charging/discharging current value $I_n$ are compared, and, when the difference between the current values is greater than a predetermined difference and it is determined that the current sensor 16 is abnormal (S109), the switch is switched to the first SOC estimator unit, the voltage detector 12 measures a present battery voltage $V_n$ (n is 1~n and does not include 0; similarly in the following description), and the thermometer 26 measures the present battery temperature $T_n$ (S304). Using a correlation map between the battery temperature T and the internal resistance R of the battery which is stored in advance, an internal resistance $R_n$ of the battery is estimated from the measured battery temperature $T_n$ (S306). Then, an estimated charging/discharging current $I_n$ is calculated using the measured battery voltage $V_n$, the open voltage $V_{ocvn-1}$ of the battery which is determined based on the state of charge (SOC) which is previously estimated, and the estimated internal resistance $R_n$ of the battery (S308). In S308, at an initial calculation of the estimated charging/discharging current $I_n$, the measured voltage $V_0$ of the battery is used as the open voltage $V_{ocvn-1}$ of the battery. Then, the estimated charging/discharging current $I_n$ is integrated to estimate $SOC_n$ (S310). When, on the other hand, the difference between the current values is a predetermined difference or smaller, it is determined that the current sensor 16 is normal (S109) and the estimated charging/discharging current $I_n$ is integrated to estimate the $SOC_n$ by the second SOC estimator unit (S110). In S108, at an initial calculation of the estimated charging/discharging current $I_n$, the measured voltage $V_0$ of the battery is used as the open voltage $V_{ocvn-1}$ of the battery. Using a correlation map between the SOC and the open voltage $V_{ocv}$ which is stored in advance, $V_{ocvn-1}$ is determined based on the determined $SOC_n$ (S112) and the next SOC is estimated based on the $V_{ocvn-1}$. In the device which uses the first and second estimator units in a switching manner as described above, even when the current sensor 16 is temporarily abnormal, the SOC can be precisely estimated through the steps of S304-S310 and S112 after it is determined that the current sensor 16 is abnormal (S109).

In addition, in the present embodiment, the measured charging/discharging current $i_n$ of the battery and the estimated charging/discharging current $I_n$ are compared and it is determined that the current sensor 16 is abnormal when the difference between the current values is greater than a predetermined difference. The present invention, however, is not limited to this configuration, and, alternatively, it is also possible to switch to the second SOC estimator unit when a change of the charging/discharging current $i_n$ of the battery becomes large, in place of the step S109 of FIG. 7 (S304-S310).

It is preferable in the first SOC estimator unit that, for example, a plurality of correlation maps between the internal resistance of the battery and the temperature of the battery are stored in advance, corresponding to different points of time as time elapses. In addition, it is also possible to continuously calculate the internal resistance of the battery using the measured charging/discharging current $i_n$, measure the battery temperature at that point, and correct the correlation map between the internal resistance and the temperature of the battery using the calculated internal resistance of the battery and the measured battery temperature in the first SOC estimator unit (that is, the process of S206-S210 and S220-S226 of FIG. 4).

As another configuration of the present invention, it is possible to employ a configuration in which a third SOC estimator unit for integrating a measured battery charging/discharging current measured by the current sensor 16 to estimate the SOC is provided, the SOC is estimated basically using the third SOC estimator unit, and, when the current sensor 16 is abnormal or the measured current value contains an error (including cases of step S109 of the fourth preferred embodiment described above and when a change of the charging/discharging current of the battery is large), the estimator unit is switched to the first SOC estimator unit or the second SOC estimator unit described above in the first through third preferred embodiments to estimate the SOC.

Fifth Preferred Embodiment

<Fifth Example Device Having a Current Detector Unit>

[Structure of a Battery State-of-Charge Estimator]

A battery state-of-charge estimator of the present embodiment has a structure identical to those in the first through fourth embodiments described above, and therefore, the elements identical to those in the first through fourth embodiments are assigned the same reference numerals and will not described again.

[Estimation of State of Charge of the Battery]

Figure 8:
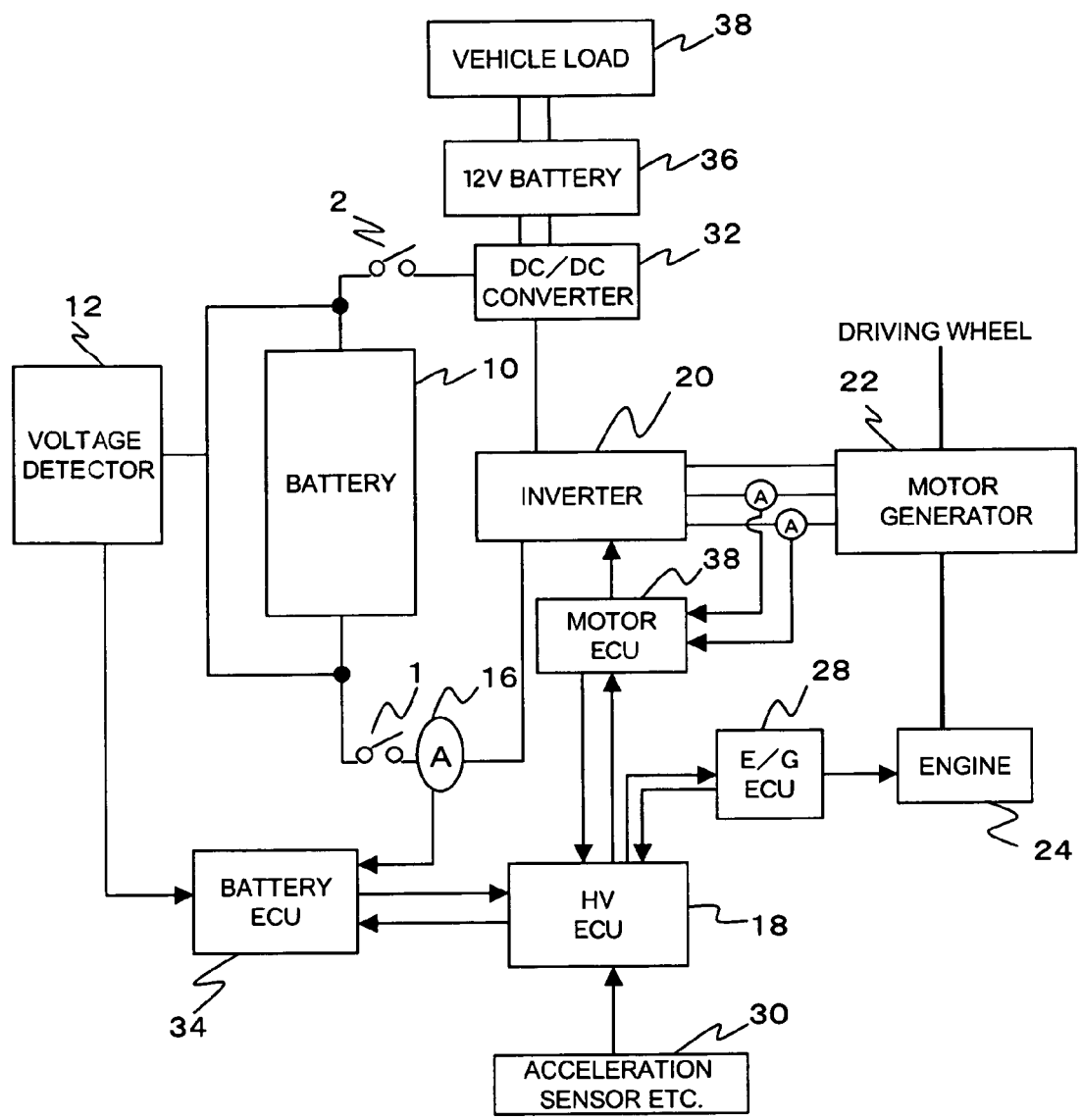
FIG. 8 is a flowchart for explaining an operation of an exemplified SOC estimation according to a fifth preferred embodiment of the present invention.

An exemplified third or fourth SOC estimator unit according to the present invention operates as shown in FIG. 8 in the battery ECU 14 as shown in FIG. 1. In addition, in the present embodiment, a battery capacity calculator device for periodically or continuously calculating the capacity of the battery is provided in the battery ECU 14 shown in FIG. 1.

As shown in FIG. 8, when IG is switched ON, the voltage detector 12 measures an initial battery voltage $V_0$ before the relays 1 and 2 are switched on (S100). Then, the initial battery voltage $V_0$ is set as an open voltage $V_{ocv1}$ (S102). The voltage detector 12 measures a present battery voltage $V_n$ (n is 1~n and does not include 0; similarly in the following description) under a loaded state after the relays 1 and 2 are switched on and the current sensor 16 measures a present charging/discharging current $i_n$ of the battery under a loaded state after the relays 1 and 2 are switched on (S104). An internal resistance $R_n$ of the battery is calculated based on the battery voltage $V_n$ and the measured battery current $i_n$ (S106). An estimated charging/discharging current $I_n$ is determined based on the measured battery voltage $V_n$, the open voltage $V_{ocvn-1}$ of the battery which is determined based on the state of charge (SOC) which is previously estimated, and the internal resistance $R_n$ of the battery which is determined through calculation (S108). In S108, at an initial calculation of the estimated charging/discharging current $I_n$, the measured voltage $V_0$ of the battery is used as the open voltage $V_{ocvn-1}$ of the battery. Then, the estimated charging/discharging current $I_n$ is integrated to estimate $SOC_n$ (S110).

Then, a battery full-capacity calculator device provided in the battery ECU 14 determines a full capacity $Ah_n$ (in a unit of A/h) of the battery based on the following equation (5) and using the $SOC_n$ and an integrated value of the measured current $i_n$ (in a unit of mA) (S320). In the equation (5), an integrated value of the measured current $i_n$ for one second is used as an example.

$$SOC_n = (\text{Integrated value of measured current } i_n/\text{full capacity } Ah_n \text{ of the battery}) \times (100/3600) \quad (5)$$

From the above equation, the full capacity $Ah_n$ of the battery is determined and $SOC_{n+1}$ is determined using the following equation (6) and based on the integrated value of the measured current $i_{n+1}$ after the battery capacity is measured (S322).

$$SOC_{n+1} = (\text{Integrated value of measured current } i_{n+1}/\text{full capacity } Ah_n \text{ of the battery}) \times (100/3600) \quad (6)$$

$SOC_n$ is replaced with the determined $SOC_{n+1}$ (S324), $V_{ocvn-1}$ is determined using a correlation map between the SOC and the open voltage $V_{ocv}$ which is stored in advance and based on the determined $SOC_n$ (S112), and the next SOC is estimated based on the $V_{ocvn-1}$.

In general, when the SOC is estimated based on the estimated charging/discharging current of the battery obtained through calculation using the measured voltage value of the battery, even if the capacity changes due to deterioration of the battery, the relationship between the SOC and the open voltage does not change, and, thus, it is possible to accurately estimate the SOC. When, however, the polarization voltage and its slight change is not taken into consideration during calculation of the open voltage, the precision of the estimated charging/discharging current value of the battery based on the open voltage is slightly reduced, and therefore, it has been difficult to highly precisely estimate the SOC. When, on the other hand, the SOC is estimated based on the measured current value of the battery as in the related art, highly precise estimation can only be achieved under conditions that the initial SOC is correct, the precision of the current sensor 16 is high, and the full capacity of the battery is always constant. Therefore, by estimating the SOC based on the full capacity of the battery as in the present embodiment, it is possible to more precisely estimate the SOC.

Sixth Preferred Embodiment

<Sixth Example Device Having a Calculation Functionality of a Remaining Amount of Energy of the Battery>

[Structure of Batter State-of-Charge Estimator]

A battery state-of-charge estimator of the present embodiment has a function to calculate an amount of remaining energy of the battery in addition to the elements of the first through fifth preferred embodiments.

[Calculation of Amount of Remaining Energy of the Battery]

In the sixth preferred embodiment of the present invention, a remaining capacity detector is provided for detecting a remaining capacity in each individual cell within the battery of FIG. 1. An output from the remaining capacity detector is sent to a calculator device for calculating the amount of remaining energy of the battery provided in the battery ECU 14. The remaining capacity detector may be provided in the battery 10 or, alternatively, may be provided external to the battery 10.

Figure 9:
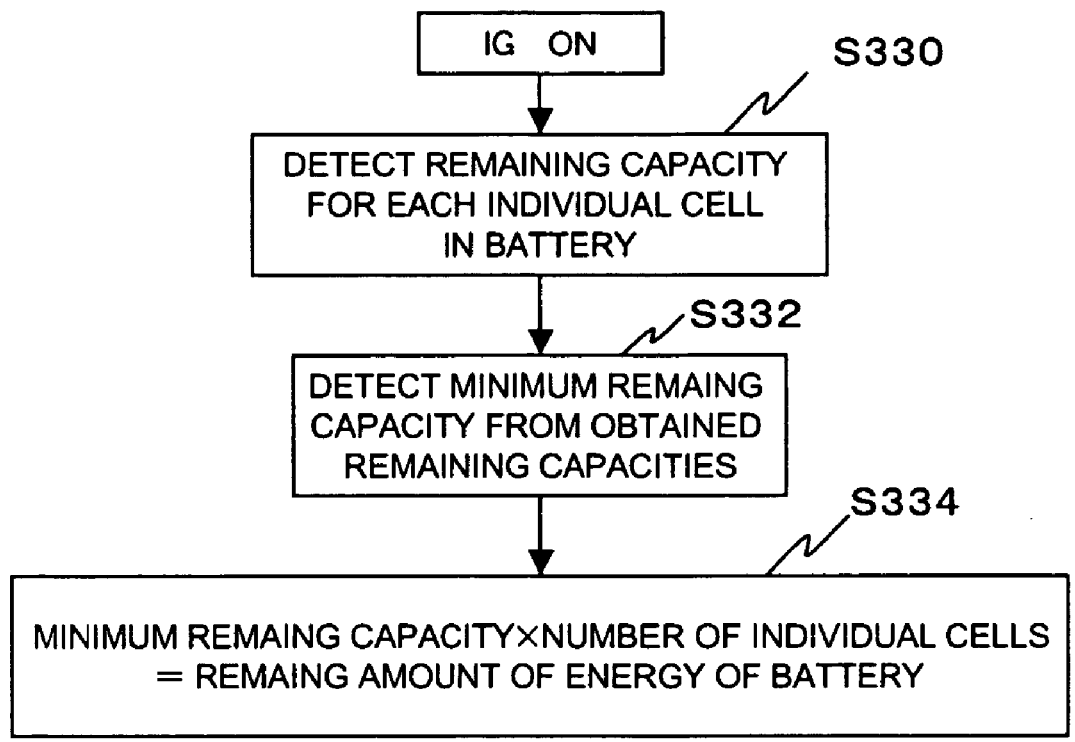
FIG. 9 is a flowchart for explaining an example operation for calculating an amount of remaining energy of the battery according to a sixth preferred embodiment of the present invention.

As shown in FIG. 9, when IG is switched ON, the remaining capacity detector detects a remaining capacity of each individual cell within the battery 10 (S330). Then, the calculator device of amount of remaining energy provided in the battery ECU 14 detects a minimum remaining capacity from among the remaining capacities of the individual cells output from the remaining capacity detector (S332) and calculates a minimum amount of remaining energy of the battery by multiplying the minimum remaining capacity by the number of individual cells.

In this manner, even when the cells in the battery 10 are individually deteriorated and the capacity of each cell changes, it is possible to know the minimum amount of remaining energy which can be extracted from the battery 10.

Seventh Preferred Embodiment

<Seventh Example Device Having a Current Detector Unit>

[Structure of a Battery State-of-Charge Estimator]

A battery state-of-charge estimator according to the seventh preferred embodiment of the present invention has a structure identical to those in the first through fifth preferred embodiments, and therefore, elements identical to those in the first through fifth preferred embodiments are assigned the same reference numerals and will not be described again.

[Estimation of State of Charge of the Battery]

In the seventh preferred embodiment of the present invention, an estimated charging/discharging current is estimated in the battery ECU 14 of FIG. 1 in consideration of the polarization voltage as will be described below.

Figure 10:
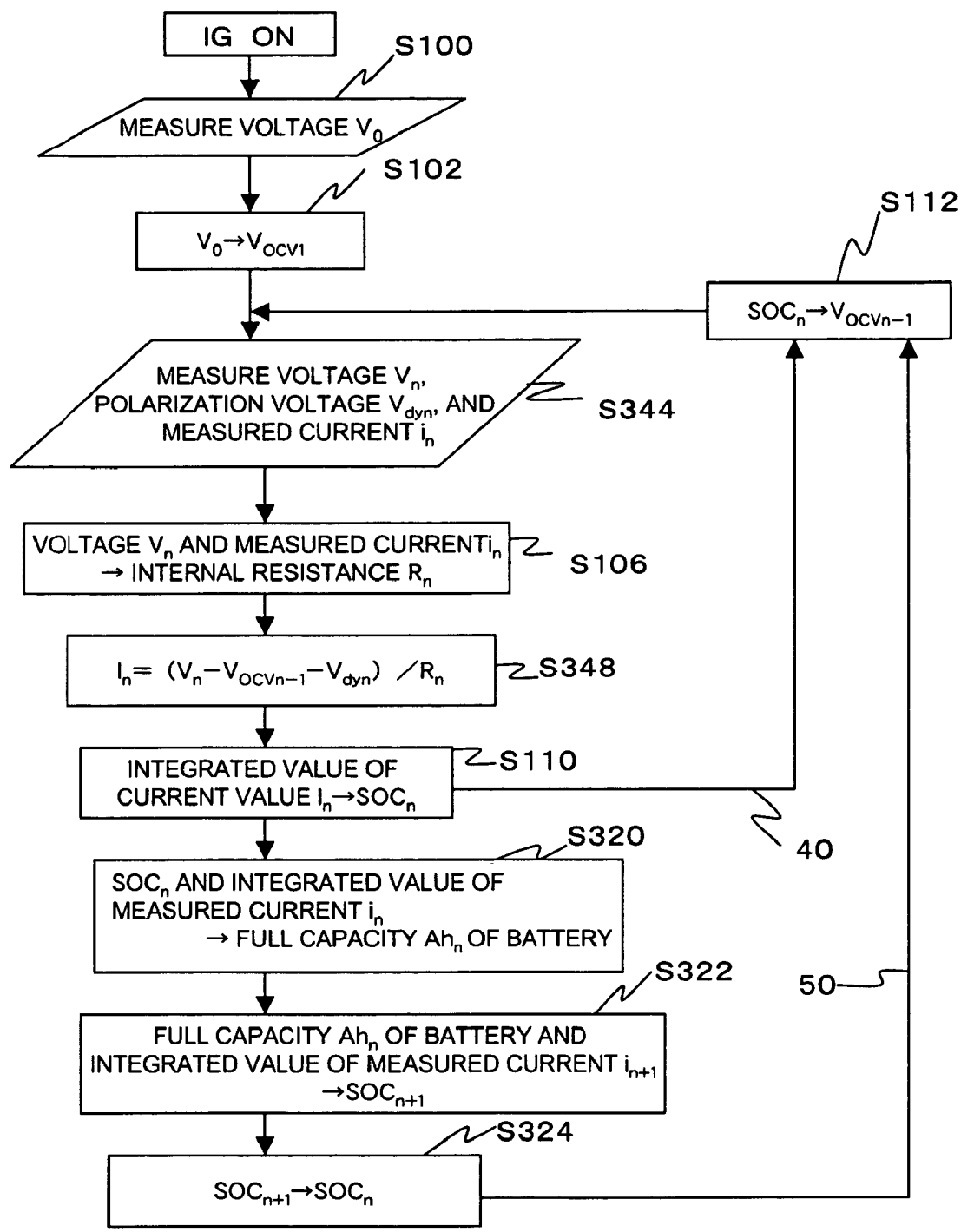
FIG. 10 is a flowchart for explaining an example operation of SOC estimation according to a seventh preferred embodiment of the present invention.

As shown in FIG. 10, when IG is switched ON, the voltage detector 12 measures an initial battery voltage $V_0$ before the relays 1 and 2 are switched on (S100). Then, the initial battery voltage $V_0$ is set as an open voltage $V_{ocv1}$ (S102). The voltage detector 12 measures a present battery voltage $V_n$ (n is 1~n and does not include 0; similarly in the following description) under a loaded state after the relays 1 and 2 are switched on, the current sensor 16 measures a present battery charging/discharging current $i_n$ under a loaded state after the relays 1 and 2 are switched on, and a polarization voltage $V_{dyn}$ is measured based on a current density in the battery 10 and a specific conductivity of an electrolytic material or an active material in the cell of the battery (S344). An internal resistance $R_n$ is determined based on the battery voltage $V_n$ and the measure battery current $i_n$ (S106). An estimated charging/discharging current $I_n$ is calculated based on the measured battery voltage $V_n$, an open voltage $V_{ocvn-1}$ of the battery which is determined based on the state of charge (SOC) which is previously estimated, an internal resistance $R_n$ of the battery determined through calculation, and the polarization voltage $V_{dyn}$ (S348). In S348, at an initial calculation of the estimated charging/discharging current $I_n$, the measured voltage $V_0$ of the battery is used as the open voltage $V_{ocvn-1}$ of the battery. Then, the estimated charging/discharging current $I_n$ is integrated to estimate $SOC_n$ (S110). Through the arrow 40, $V_{ocvn-1}$ is determined based on the determined $SOC_n$ using a correlation map between the SOC and the open voltage $V_{ocv}$ which is stored in advance (S112) and the next SOC is estimated based on the $V_{ocvn-1}$.

Figure 6:
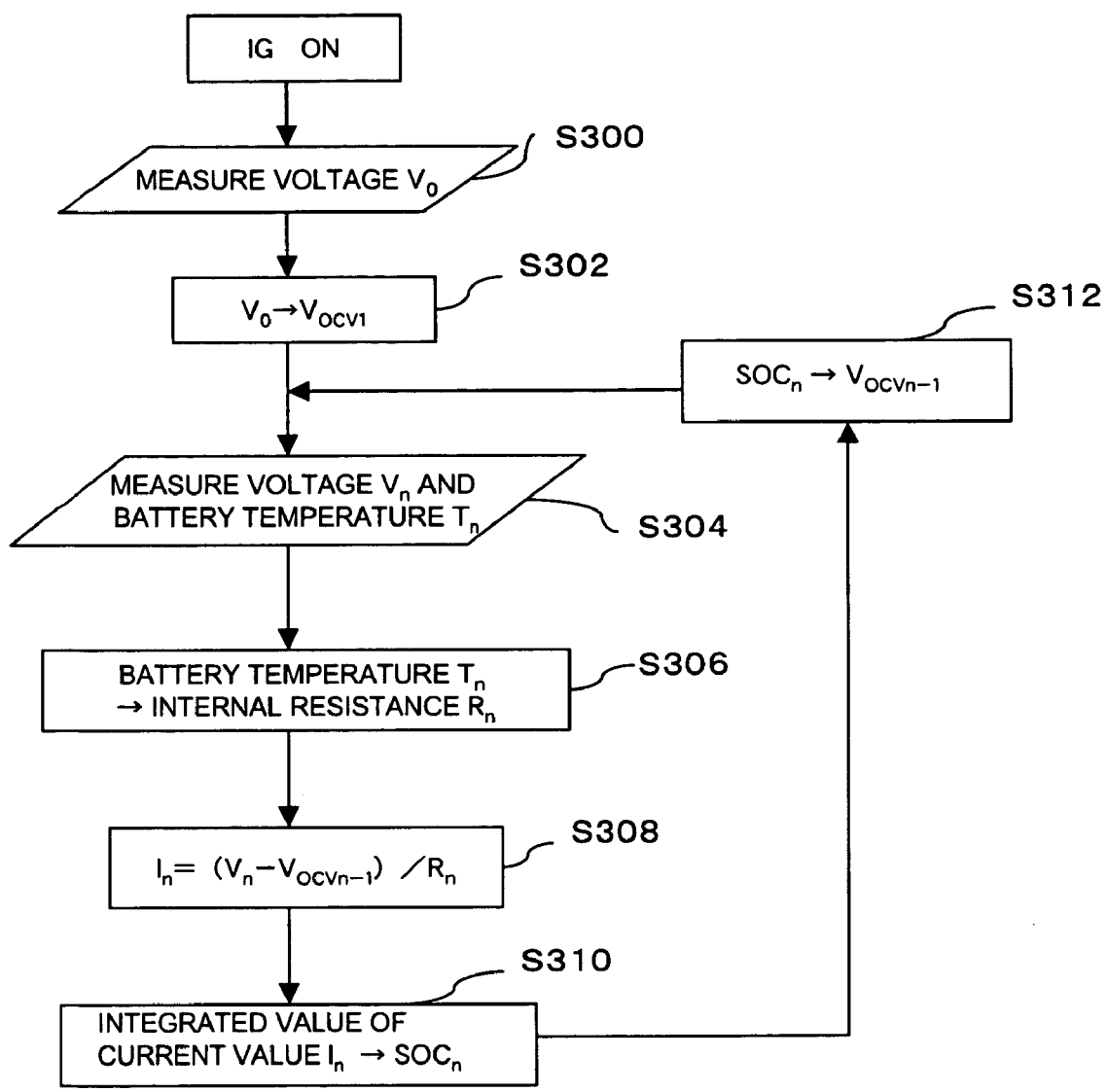
FIG. 6 is a flowchart for explaining an operation of another example structure of a first SOC estimator unit according to a third preferred embodiment of the present invention.

In the above-described preferred embodiment, a measured current $i_n$ which is measured by the current sensor 16 of FIG. 1 is used, but the present invention is not limited to such a configuration, and it is possible to employ a configuration in which the current sensor 16 shown in FIG. 5 is not used, a measured voltage and the battery temperature are determined using the voltage detector 12 and a thermometer 26, the voltage detector 12 measures the present battery voltage $V_n$ and the thermometer 26 measures the current battery temperature $T_n$ (S304), an internal resistance $R_n$ of the battery is estimated based on the measured battery temperature $T_n$ using a correlation map between the battery temperature T and the internal resistance R of the battery which is stored in advance (S306) as shown in FIG. 6, an estimated charging/discharging current $I_n$ is determined based on the measured battery voltage $V_n$, the open voltage $V_{ocvn-1}$ of the battery which is determined based on the state of charge (SOC) which is previously estimated, and the internal resistance $R_n$ of the battery and the polarization voltage $V_{dyn}$ which are determined through calculation (S348) as shown in FIG. 10, and the estimated charging/discharging current $I_n$ is integrated to estimate $SOC_n$ (S110) Similar to the above, through the arrow 40, $V_{ocvn-1}$ is determined based on the determined $SOC_n$ using a correlation map between the SOC and the open voltage $V_{ocv}$ which is stored in advance (S112), and the next SOC is estimated based on the $V_{ocvn-1}$.

By considering the polarization voltage of the battery as described, it is possible to more precisely estimate the SOC. In particular, in a lithium battery, the polarization during charging or discharging may affect the estimation of the SOC, and thus the precision may be improved by ±5%~±10% with the above structure when applied to the lithium battery.

In addition, it is also possible to employ a configuration of the fifth preferred embodiment as described above with the $SOC_n$ estimated in S110. In other words, as described above regarding the fifth preferred embodiment, it is possible to employ a configuration in which a full capacity $Ah_n$ of the battery is determined based on the above-described equation (5) using the $SOC_n$ and an integrated value of the measured current $i_n$ in the battery full-capacity calculator device provided in the battery ECU 14 (S320), $SOC_{n+1}$ is determined based on the integrated value of the measured current $i_{n+1}$ after the full capacity of the battery is measured using equation (6) (S322), the $SOC_n$ is replaced with the determined $SOC_{n+1}$ (S324), through the arrow 50, $V_{ocvn-1}$ is determined based on the determined $SOC_n$ using a correlation map between the SOC and the open voltage $V_{ocv}$ which is stored in advance (S112), and the next SOC is estimated based on the $V_{ocvn-1}$.

Eighth Preferred Embodiment

<Eighth Example Device Having a Current Detector Unit>

[Structure of a Battery State-of-Charge Estimator]

A battery state-of-charge estimator according to the eighth preferred embodiment of the present invention has a structure identical to those in the first through seventh preferred embodiments, and elements identical to those in the first through seventh preferred embodiments are assigned the same reference numerals and will not be described again.

[Estimation of State of Charge of the Battery]

In the eighth preferred embodiment of the present invention, an estimated charging/discharging current is estimated considering the polarization voltage in the battery ECU 14 of FIG. 1 as will be described below, and, at the same time, another current sensor abnormality determination device is provided in the battery ECU 14 of FIG. 1. The current sensor abnormality determination device compares the measured charging/discharging current $i_n$ which is detected by the current sensor 16 and an estimated charging/discharging current $I_n$ which will be described below and determines that the current sensor 16 is abnormal when an absolute value of a difference between the charging/discharging currents $i_n$ and $I_n$ is greater than a predetermined difference and that the current sensor 16 is normal when the difference is a predetermined difference or smaller. In such a configuration, the SOC estimator unit as shown in FIG. 11 is switched.

Figure 11:
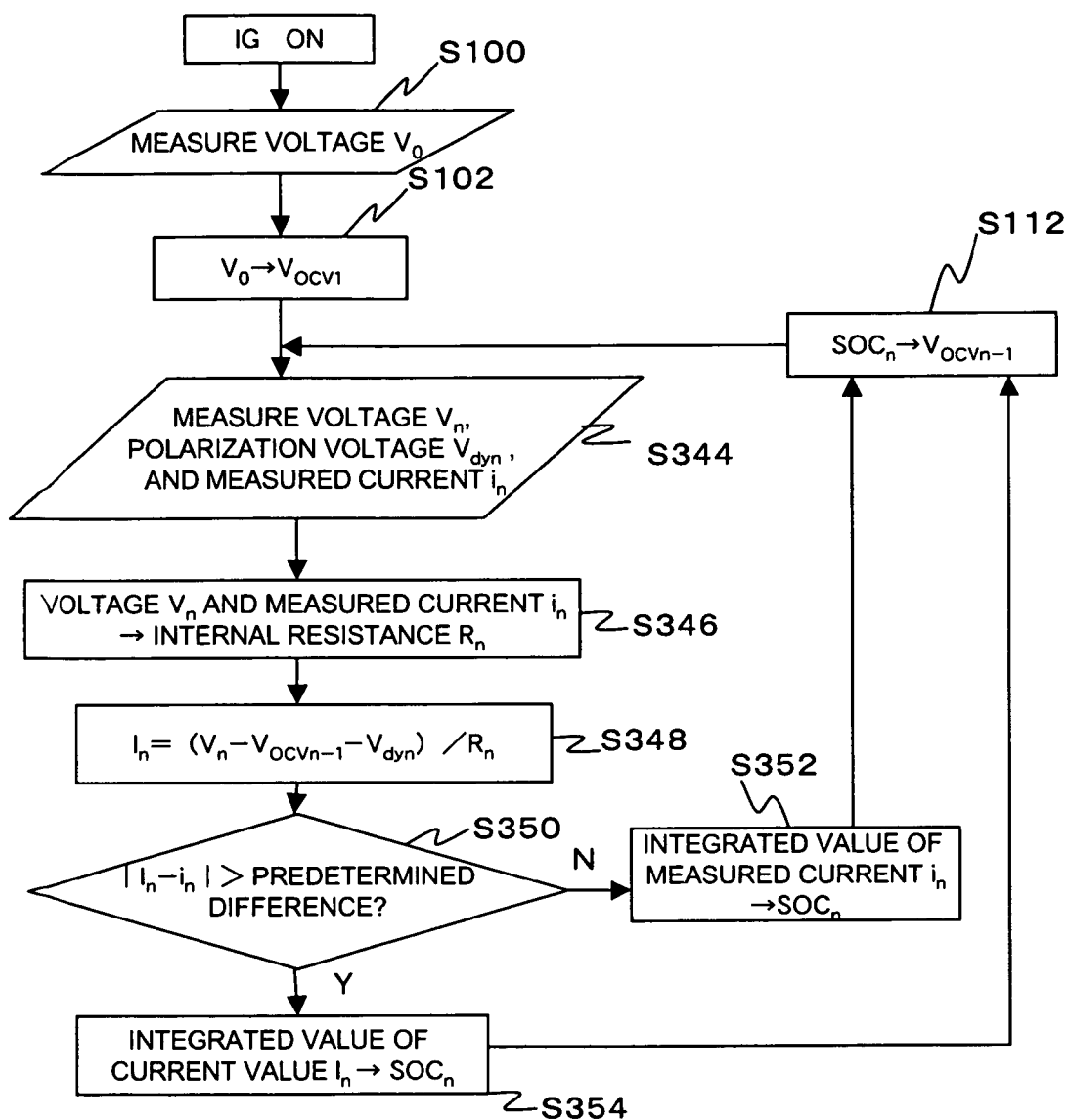
FIG. 11 is a flowchart for explaining an example operation of SOC estimation according to an eighth preferred embodiment of the present invention.

As shown in FIG. 11, when IG is switched ON, the voltage detector 12 measures an initial battery voltage $V_0$ before the relays 1 and 2 are switched on (S100). Then, the initial battery voltage $V_0$ is set as an open voltage $V_{ocv1}$ (S102). The voltage detector 12 measures a present battery voltage $V_n$ (n is 1~n and does not include 0; similarly in the following description) under a loaded state after the relays 1 and 2 are switched on, the current sensor 16 measures a present charging/discharging current $i_n$ of the battery under a loaded state after the relays 1 and 2 are switched on, and a polarization voltage $V_{dyn}$ is measured based on a current density in the battery 10 and a specific conductivity of an electrolytic material or an active material within the cell of the battery (S344). An internal resistance $R_n$ of the battery is determined based on the battery voltage $V_n$ and the measured battery current $i_n$ (S346). Then, an estimated charging/discharging current $I_n$ is determined based on the measured battery voltage $V_n$, the open voltage $V_{ocvn-1}$ of the battery which is determined based on the state of charge (SOC) which is previously estimated, and the internal resistance $R_n$ of the battery and the polarization voltage $V_{dyn}$ which are determined through calculation (S348). In S348, at an initial calculation of the estimated charging/discharging current $I_n$, the measured voltage $V_0$ of the battery is used as the open voltage $V_{ocvn-1}$ of the battery.

Then, the measured charging/discharging current $i_n$ of the battery and the estimated charging/discharging current value $I_n$ are compared. When an absolute value of a difference between the current values $i_n$ and $I_n$ is greater than a predetermined difference, it is determined that the current sensor 16 is abnormal (S305) and the estimated charging/discharging current value $I_n$ is integrated to estimate $SOC_n$ (S354). When, on the other hand, the absolute value of the difference between the current values is a predetermined difference or smaller, it is determined that the current sensor 16 is normal (S305) and the measured charging/discharging current $i_n$ of the battery is integrated to estimate $SOC_n$ (S352). $V_{ocvn-1}$ is determined based on the determined $SOC_n$ using a correlation map between the SOC and the open voltage $V_{ocv}$ which is stored in advance (S112) and the next SOC is estimated based on the $V_{ocvn-1}$.

In the above-described preferred embodiment, the measured current $i_n$ measured by the current sensor 16 of FIG. 1 is used. The present invention, however, is not limited to such a configuration, and it is also possible to employ a configuration in which the current sensor 16 of FIG. 5 is not used and the voltage detector 12 and the thermometer 26 are used for measured voltage and battery temperature. That is, it is also possible to employ a configuration in which, as shown in FIG. 6, the voltage detector 12 measures a present battery voltage $V_n$ and a thermometer 26 measures a present battery temperature $T_n$ (S304), and an internal resistance $R_n$ of the battery is estimated based on the measured battery temperature $T_n$ using a correlation map between the battery temperature T and the internal resistance R of the battery which is stored in advance (S306) and then, as shown in FIG. 11, an estimated charging/discharging current $I_n$ is determined using the measured battery voltage $V_n$, an open voltage $V_{ocvn-1}$ of the battery which is determined based on the state of charge (SOC) which is previously estimated, and an internal resistance $R_n$ of the battery and the polarization voltage $V_{dyn}$ which are determined through calculation (S348), the measured charging/discharging current $i_n$ of the battery and the estimated charging/discharging current value $I_n$ are compared, and, when an absolute value of a difference between the current values is greater than a predetermined difference, it is determined that the current sensor 16 is abnormal (S305) and the estimated charging/discharging current value $I_n$ is integrated to estimate $SOC_n$ (S354). When, on the other hand, the absolute value of the difference between the current values is a predetermined difference of smaller, it is determined that the current sensor 16 is normal (S305) and the measured charging/discharging current $i_n$ of the battery is integrated to estimate $SOC_n$ (S352). Then, $V_{ocvn-1}$ is determined based on the determined $SOC_n$ using a correlation map between the SOC and the open voltage $V_{ocv}$ which is stored in advance (S112) and the next SOC is estimated based on the $V_{ocvn-1}$.

With a structure as described above, the precision of the current sensor 16 can be determined and it is possible to more precisely estimate the SOC using a more accurate charging/discharging current value.

Ninth Preferred Embodiment

<Ninth Example Device Having a Current Detector Unit>

[Structure of a Battery State-of-Charge Estimator]

A battery state-of-charge estimator according to a ninth preferred embodiment of the present invention has a structure identical to those in the first through eighth preferred embodiments, and the elements identical to those in the first through eighth preferred embodiments will be assigned the same reference numerals and will not be described again.

[Estimation of State of Charge of the Battery]

Figure 12:
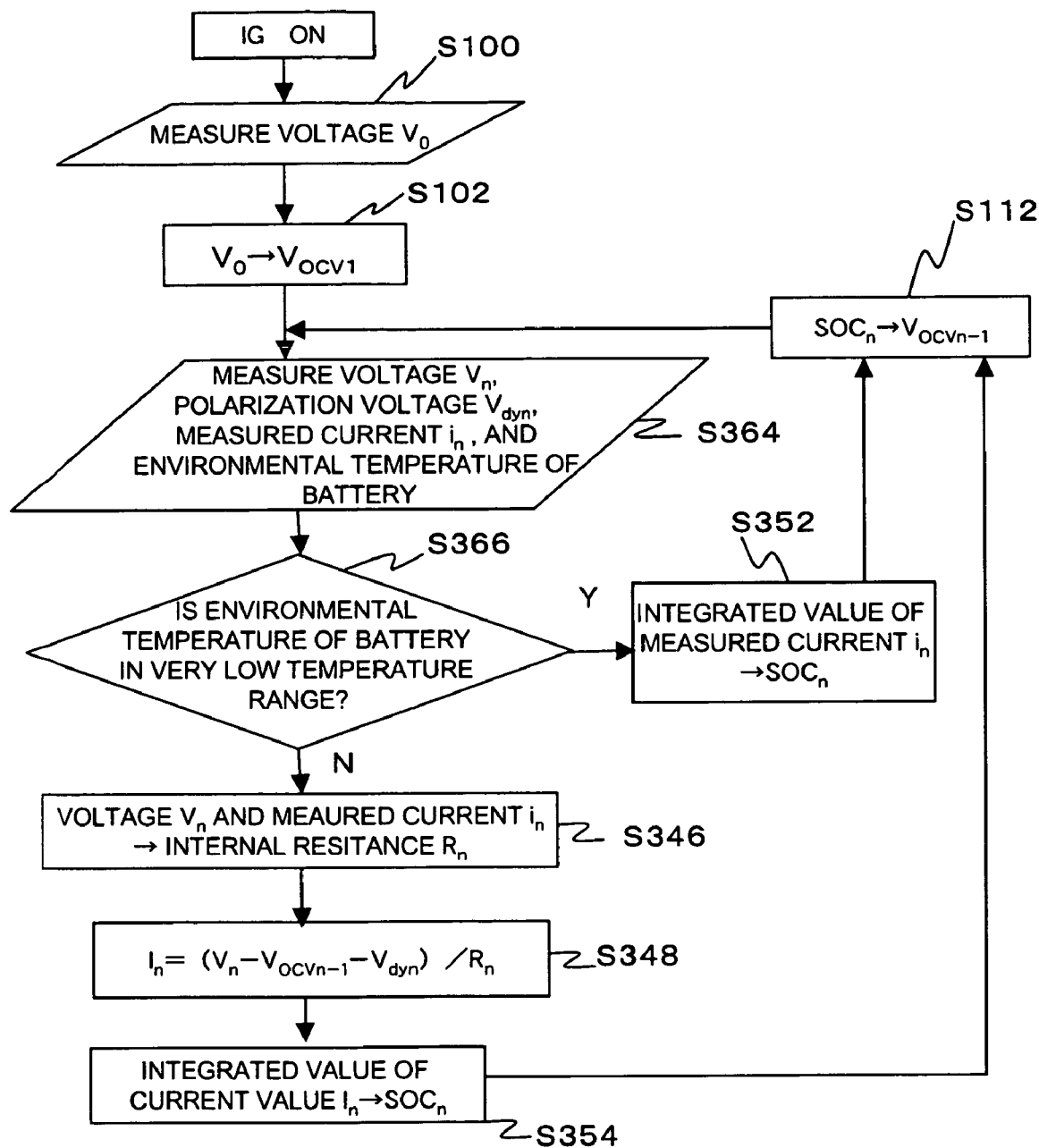
FIG. 12 is a flowchart for explaining an example operation of SOC estimation according to a ninth preferred embodiment of the present invention.

In the ninth preferred embodiment of the present invention, an estimated charging/discharging current is estimated considering the polarization voltage in the battery ECU 14 of FIG. 1 as will be described below and a switching device for switching between SOC estimator units depending on an environmental temperature of the battery as shown in FIG. 12 is provided in the battery ECU 14 of FIG. 1. As used herein, the environmental temperature of the battery may be a temperature near an outer wall of the battery 10 of FIG. 1 or a temperature of the environment outside the battery or vehicle.

As shown in FIG. 12, when IG is switched ON, the voltage detector 12 measures an initial battery voltage $V_0$ before the relays 1 and 2 are switched on (S100). Then, the initial battery voltage $V_0$ is set as an open voltage $V_{ocv1}$ (S102). The voltage detector 12 measures a present battery voltage $V_n$ (n is 1~n and does not include 0; similarly in the following description) under a loaded state after the relays 1 and 2 are switched on, the current sensor 16 detects a present charging/discharging current $i_n$ of the battery under a loaded state after the relays 1 and 2 are switched on, a polarization voltage $V_{dyn}$ is measured based on a current density in the battery 10 and a specific conductivity of an electrolytic material or an active material in the cell of the battery, and another thermometer (not shown) measures an environmental temperature of the battery (S364).

Then, it is determined whether or not the environmental temperature of the battery is within a very low temperature range (for example, −30° C.~−20° C.) (S366), and, when the environmental temperature of the battery is very low, the measured charging/discharging current $i_n$ is integrated to estimate $SOC_n$ (S352). On the other hand, when the environmental temperature of the battery is not within the very low temperature range, an internal resistance $R_n$ of the battery is determined based on the battery voltage $V_n$ and the measured battery current $i_n$ (S346). In addition, an estimated charging/discharging current $I_n$ is determined based on the measured battery voltage $V_n$, an open voltage $V_{ocvn-1}$ of the battery which is determined based on the state of charge (SOC) which is previously estimated, and the internal resistance $R_n$ of the battery and the polarization voltage $V_{dyn}$ which are determined through calculation (S348). In S348, at an initial calculation of the estimated charging/discharging current $I_n$, the measured voltage $V_0$ of the battery is used as the open voltage $V_{ocv-1}$ of the battery. Then, the estimated charging/discharging current $I_n$ is integrated to estimate $SOC_n$ (S354). Using a correlation map between the SOC and the open voltage $V_{ocv}$ which is stored in advance, $V_{ocvn-1}$ is determined based on the $SOC_n$ determined corresponding to the environmental temperature of the battery (S112) and the next SOC is estimated based on the $V_{ocvn-1}$.

In the above-described preferred embodiment, the measured current $i_n$ which is measured by the current sensor 16 of FIG. 1 is used, but the present invention is not limited to such a configuration and it is also possible to employ a configuration in which a current sensor 16 of FIG. 5 is not used, a voltage detector 12 and a thermometer 26 are used, and the measured voltage and the battery temperature are used. That is, it is possible to employ a configuration in which, as shown in FIG. 6, the voltage detector 12 measures a present battery voltage $V_n$ and a thermometer 26 measures a present battery temperature $T_n$ (S304) and an internal resistance $R_n$ of the battery is estimated based on the measured battery temperature $T_n$ using a correlation map between the battery temperature T and the internal resistance R of the battery which is stored in advance (S306), and, when the environmental temperature of the battery is not in the very low temperature range, an estimated charging/discharging current $I_n$ is determined using the measured battery voltage $V_n$, an open voltage $V_{ocvn-1}$ of the battery which is determined based on the state of charge (SOC) which is previously estimated, and the internal resistance R of the battery and the polarization voltage $V_{dyn}$ which are determined through calculation (S348), and the estimated charging/discharging current value $I_n$ is integrated to estimate the $SOC_n$ (S354), as shown in FIG. 12. Then, using a correlation map between the SOC and the open voltage $V_{ocv}$ which is stored in advance, $V_{ocvn-1}$ is determined based on the determined $SOC_n$ (S112) and the next SOC is estimated based on the $V_{ocvn-1}$.

Depending on the temperature range of the environmental temperature of the battery, there may be cases in which the detection precision of the current sensor 16 is high and cases in which the precision of the estimated charging/discharging current value is high, and, thus, it is possible to estimate the SOC using a more precise value. For example, near a very low temperature range (for example, −30° C.~−20° C.), the internal resistance of the battery and the polarization voltage become large, and, consequently, there is a possibility that the precision of the estimated charging/discharging current value in step S348 may be degraded. In such cases, the precision of the SOC can be improved by integrating the measured charging/discharging current $i_n$ from the current sensor 16 to estimate the SOC in the very low temperature range.

Tenth Preferred Embodiment

<Tenth Example Device Having a Current Detector Unit>

[Structure of a Battery State-of-Charge Estimator]

A battery state-of-charge estimator according to the tenth preferred embodiment has a structure identical to those in the first through ninth preferred embodiments, and the elements identical to those in the first through ninth preferred embodiments will be assigned the same reference numerals and will not be described again.

[Estimation of State of Charge of Battery]

In the tenth preferred embodiment of the present invention, an estimated charging/discharging current is estimated considering a polarization voltage in the battery ECU 14 of FIG. 1 as will be described below and a charging/discharging prohibition device is provided in the battery ECU 14 of FIG. 1 which determines whether or not an absolute value of the estimated charging/discharging current $I_n$ to be described later exceeds a predetermined value and prohibits charging and discharging of the battery when the absolute value of the estimated charging/discharging current $I_n$ exceeds the predetermined value.

Figure 13:
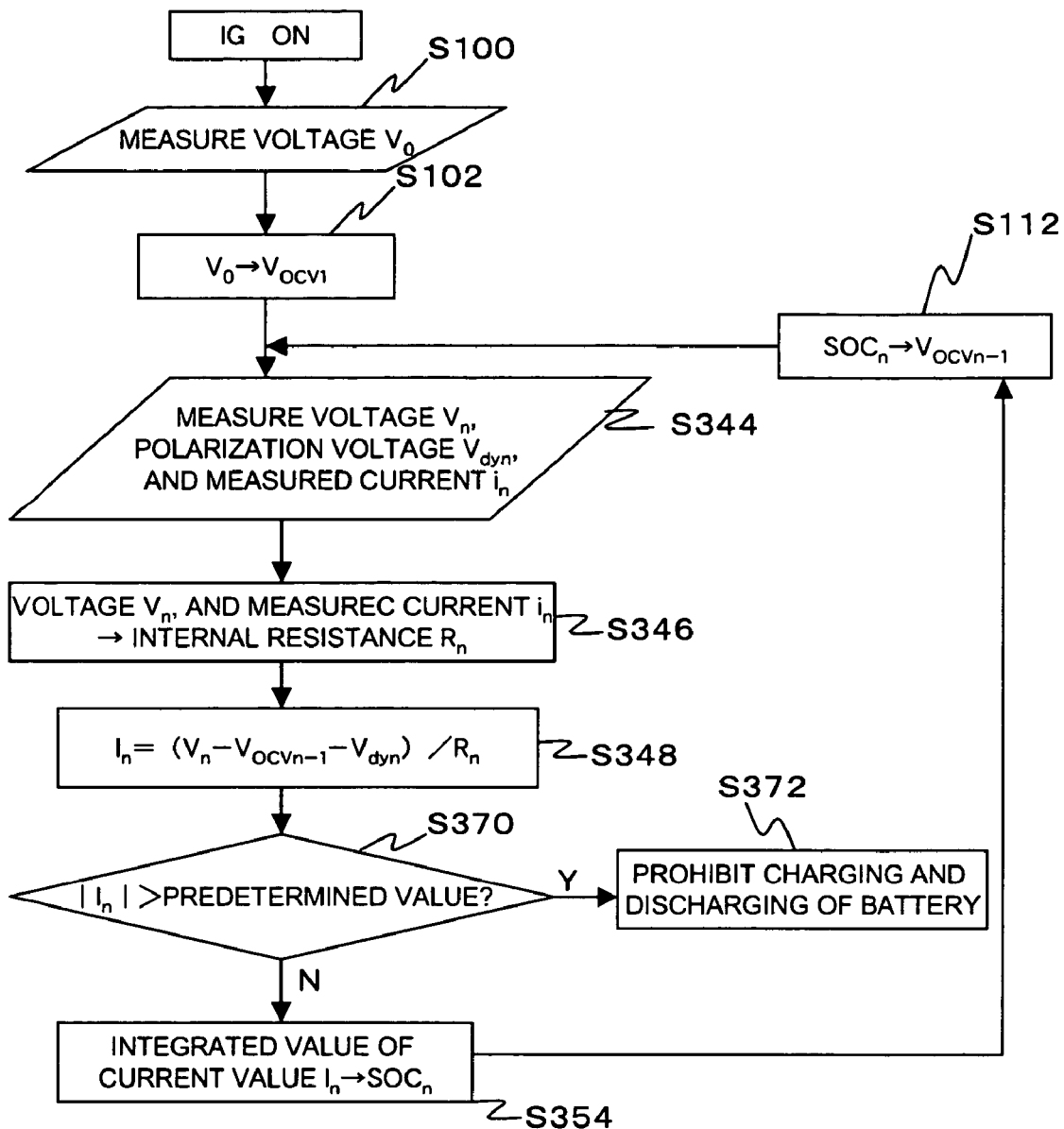
FIG. 13 is a flowchart for explaining an example operation of SOC estimation according to a tenth preferred embodiment of the present invention.
Figure 14:
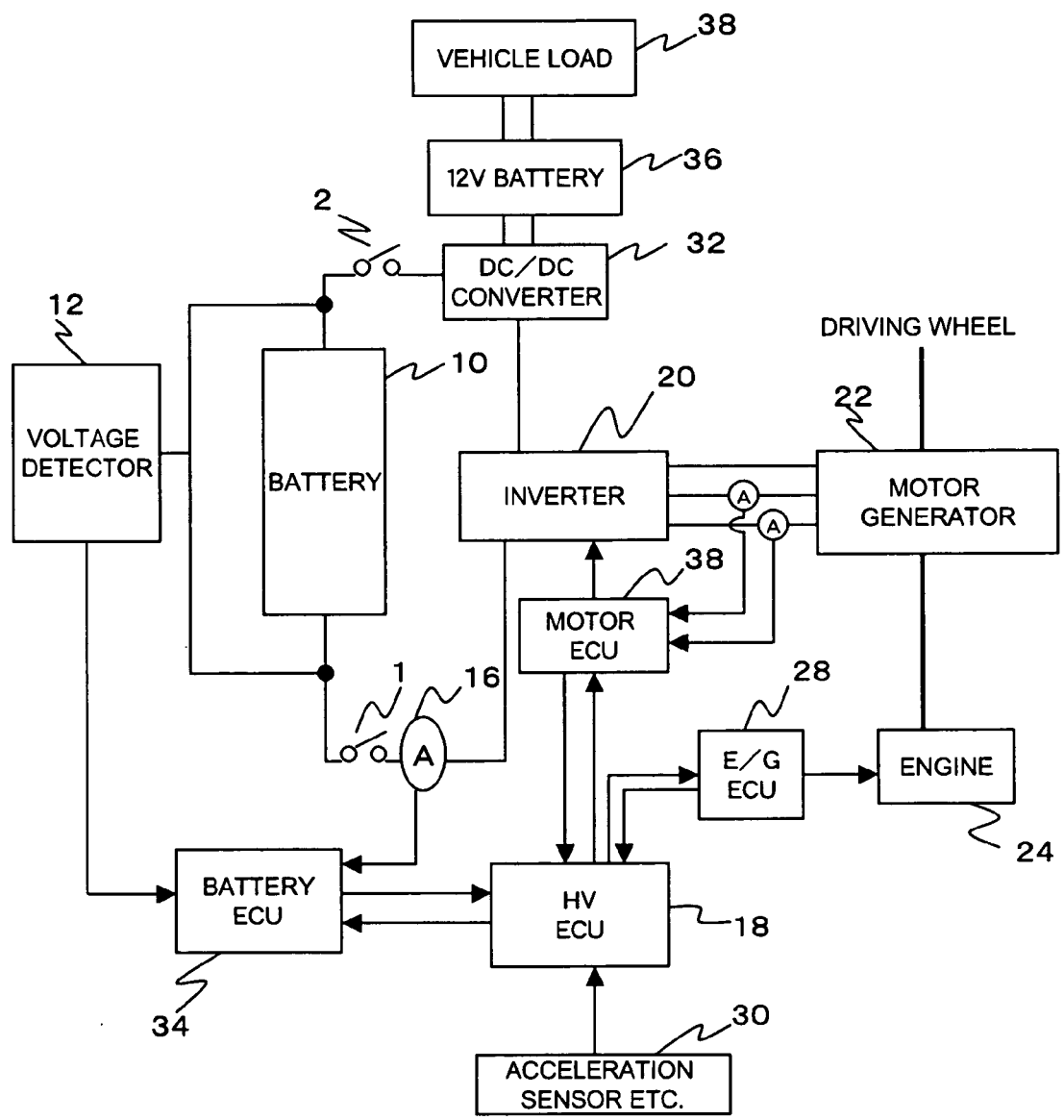
FIG. 14 is a block diagram showing a structure of a system in which a battery state-of-charge controller according to a related art is applied in a hybrid electric vehicle.
Figure 15:
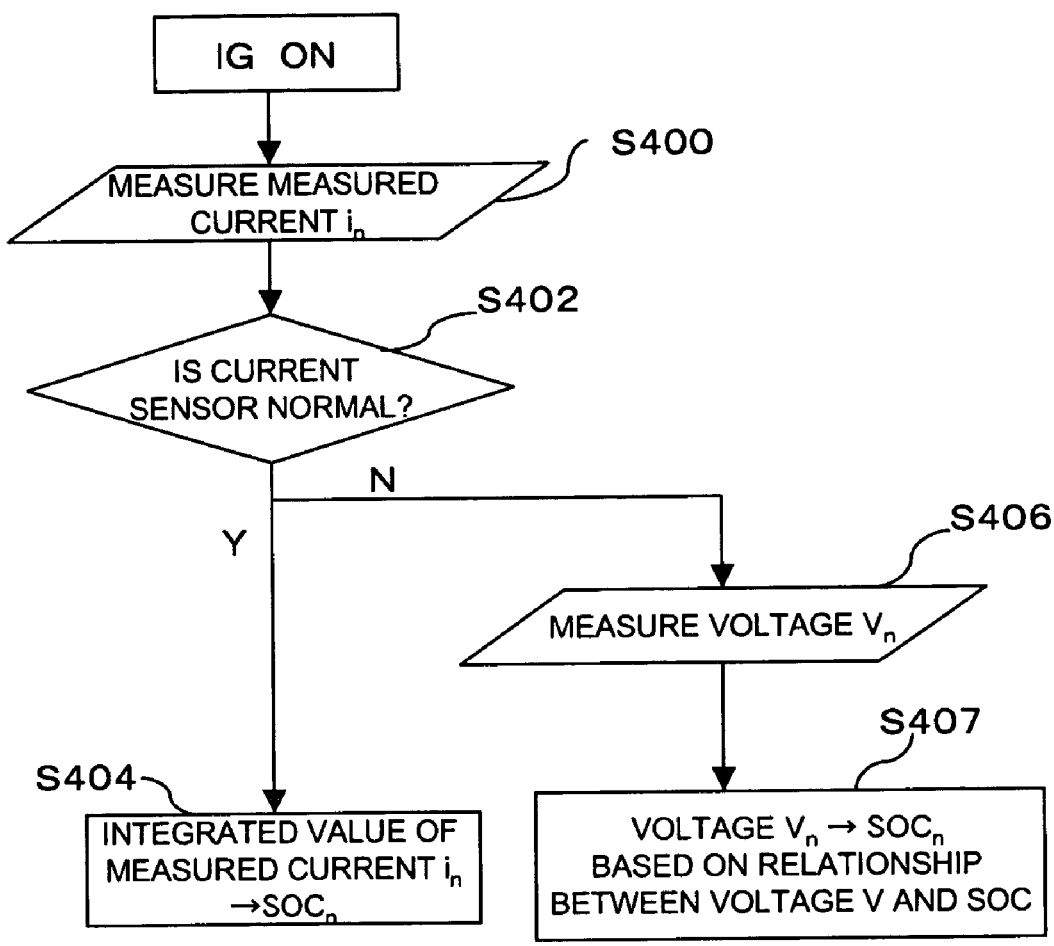
FIG. 15 is a flowchart for explaining an operation of an SOC estimator unit of a battery state-of-charge controller according to a related art.

As shown in FIG. 13, when IG is switched ON, the voltage detector 12 measures an initial battery voltage $V_0$ before the relays 1 and 2 are switched on (S100). Then, the initial battery voltage $V_0$ is set as an open voltage $V_{ocv1}$ (S102). The voltage detector 12 measures a present battery voltage $V_n$ (n is 1~n and does not include 0; similarly in the following description) under a loaded state after the relays 1 and 2 are switched on, the current sensor 16 measures a present charging/discharging current $i_n$ of the battery under a loaded state after the relays 1 and 2 are switched on, and a polarization voltage $V_{dyn}$ is measured based on a current density in the battery 10 and a specific conductivity of an electrolytic material or an active material in the cell of the battery (S344). An internal resistance $R_n$ of the battery is determined based on the battery voltage $V_n$ and the measured battery current $i_n$ (S346). Then, an estimated charging/discharging current $I_n$ is determined using the measured battery voltage $V_n$, an open voltage $V_{ocvn-1}$ of the battery which is determined based on the state of charge (SOC) which is previously estimated, and the internal resistance $R_n$ of the battery and the polarization voltage $V_{dyn}$ which are determined through calculation (S348). In S348, at an initial calculation of the estimated charging/discharging current $I_n$, the measured voltage $V_0$ of the battery is used as the open voltage $V_{ocvn-1}$ of the battery.

Then, it is determined whether or not an absolute value of the estimated charging/discharging current value $I_n$ is greater than a predetermined value (S370), and, when the absolute value of the estimated charging/discharging current value $I_n$ is greater than the predetermined value, it is determined that the current is an abnormal current and the charging and discharging of the battery is prohibited (S372). On the other hand, when the absolute value of the estimated charging/discharging current $I_n$ is a predetermined value or smaller, the estimated charging/discharging current value $I_n$ is integrated to estimate $SOC_n$ (S354). Then, $V_{ocvn-1}$ is determined based on the determined $SOC_n$ using a correlation map between the SOC and the open voltage $V_{ocv}$ which is stored in advance (S112) and the next SOC is estimated based on the $V_{ocvn-1}$.

In the above-described preferred embodiment, the measured current $i_n$ which is measured by the current sensor 16 of FIG. 1 is used, but the present invention is not limited to such a configuration, and it is also possible to employ a configuration in which the current sensor 16 of FIG. 5 is not used, a voltage detector 12 and a thermometer 26 are used, and a measured voltage and a battery temperature are used. That is, it is also possible to employ a configuration in which, as shown in FIG. 6, the voltage detector 12 measures a present battery voltage $V_n$ and a thermometer 26 measures a present battery temperature $T_n$ (S304) and an internal resistance $R_n$ of the battery is estimated based on the measured battery temperature $T_n$ using a correlation map between the battery temperature T and the internal resistance R of the battery which is stored in advance (S306), and, as shown in FIG. 13, an estimated charging/discharging current value $I_n$ is determined using the measured battery voltage $V_n$, an open voltage $V_{ocvn-1}$ of the battery which is determined based on the state of charge (SOC) which is previously estimated, and the internal resistance $R_n$ of the battery and the polarization voltage $V_{dyn}$ which are determined through calculation (S348), it is determined whether or not an absolute value of the estimated charging/discharging current value $I_n$ is greater than a predetermined value (for example, 120 A in absolute value) (S370), similar to the above, when the absolute value is greater than the predetermined value, charging and discharging of the battery is prohibited (S372) and when, on the other hand, the absolute value of the estimated charging/discharging current value $I_n$ is a predetermined value or smaller, the estimated charging/discharging current value $I_n$ is integrated to estimate $SOC_n$ (S354), $V_{ocvn-1}$ is determined based on the determined $SOC_n$ using a correlation map between the SOC and the open voltage $V_{ocv}$ which is stored in advance (S112), and the next SOC is estimated based on the $V_{ocvn-1}$.

In general, because of a design of a current sensor, the current sensor cannot accurately measure a current value when the current exceeds a normal usage range (for example, −120 A~120 A). On the other hand, the estimated charging/discharging current $I_n$ considering the polarization voltage allows measurement in a wider range than the measured charging/discharging current $i_n$ by the current sensor 16. Therefore, it is effective to set, as a prohibition condition of charging or discharging the battery, whether or not the estimated charging/discharging current $I_n$ which is highly precise in a wider range exceeds a predetermined value which is set as an abnormal current value in advance.

In any of the first through tenth preferred embodiments as described above, it is preferable that the SOC is periodically estimated at a predetermined interval. With such a configuration, it is possible to know a more recent state of charge of the battery.

As described, according to the present invention, it is possible to precisely estimate the SOC.

Although the present invention has been described in detail, the description should not be construed as limiting the present invention.

INDUSTRIAL APPLICABILITY

A battery state-of-charge estimator of the present invention is used for, for example, estimating a state of charge of a battery which is equipped in a vehicle.

The invention claimed is:

1. A battery state-of-charge estimator comprising:
    a voltage detector unit which detects a voltage of a battery;
    an internal resistance estimator unit which estimates an internal resistance of the battery;
    an estimated charging/discharging current calculator unit which calculates an estimated charging/discharging current of the battery based on the internal resistance of the battery determined by the internal resistance estimator unit, the voltage of the battery, and an open voltage of the battery;
    an SOC estimator unit which estimates a state of charge SOC of the battery based on the estimated charging/discharging current determined by the estimated charging/discharging current calculator unit;
    an open voltage calculator unit which sets the detected voltage of the battery as the open voltage of the battery at an initial calculation of the charging/discharging current and, after the initial calculation, calculates the open voltage of the battery based on the SOC which is previously estimated, and
    a current detection abnormality detector unit which compares the measured charging/discharging current value which is detected by the current detector which detects the charging/discharging current of the battery and the estimated charging/discharging current value which is determined by one of the estimated charging/discharging current calculator unit, the first charging/discharging current calculator unit, and the second charging/discharging current calculator unit, and determines that the current detector unit is abnormal when a difference between the current values is greater than a predetermined difference and that the current detector unit is normal when the difference is a predetermined value or smaller,
    wherein the estimated charging/discharging current calculator unit, a first charging/discharging current calculator unit, or a second charging/discharging current calculator unit calculates the estimated charging/discharging current of the battery based on the internal resistance of the battery, the voltage of the battery, the open voltage of the battery, and a polarization voltage, and
    wherein the SOC is estimated based on the estimated charging/discharging current value when the current detection abnormality detector unit determines that the current detector unit is abnormal and the SOC is estimated using the measured charging/discharging current value when the current detection abnormality detector unit determines that the current detector unit is normal.

2. A battery state-of-charge estimator according to claim 1, wherein SOC estimator unit periodically estimates the SOC at a predetermined interval.

3. A battery state-of-charge estimator according to claim 1, further comprising:
    a current detector unit which detects a charging/discharging current of the battery;
    a first battery full-capacity calculator unit which determines a full capacity of the battery based on the SOC which is estimated by the SOC estimator unit and an integrated value of the charging/discharging current of the battery which is detected by the current detector unit during the estimation of the SOC; and
    a second SOC estimator unit which estimates a state of charge of the battery based on the full capacity of the battery which is obtained by the first battery full-capacity calculator unit and the measured charging/discharging current of the battery which is detected by the current detector unit.

4. A battery state-of-charge estimator according to claim 3, further comprising:
    a second battery full-capacity calculator unit which determines a full capacity of the battery based on the SOC which is estimated by the first SOC estimator unit or the second SOC estimator unit and an integrated value of the charging/discharging current of the battery which is detected by the current detector unit during the estimation of the SOC, and
    a second SOC estimator unit which estimates a state of charge of the battery based on the full capacity of the battery which is obtained by the second battery full-capacity calculator unit and the measured charging/discharging current of the battery which is detected by the current detector unit.

5. A battery state-of-charge estimator according to claim 3, further comprising:
    a remaining capacity detector unit which detects a remaining capacity of each individual cell within the battery; and
    a remaining energy calculator unit which detects a minimum remaining capacity based on the remaining capacity of each individual cell which is obtained from the remaining capacity detector unit and calculates an amount of remaining energy of the battery based on the minimum remaining capacity.

6. A battery state-of-charge estimator according to claim 1, wherein in consideration of on an environmental temperature of the battery, one of the measured charging/discharging current value which is detected by the current detector unit which detects the charging/discharging current of the battery and the estimated charging/discharging current value which is determined by one of the estimated charging/discharging current calculator unit, the first charging/discharging current calculator unit, and the second charging/discharging current unit is selected and the SOC is estimated based on the selected charging/discharging current value.

7. A battery state-of-charge estimator according to claim 1, further comprising:

a charging/discharging prohibiting unit which prohibits charging and discharging of the battery when the charging/discharging current of the battery considering the polarization voltage exceeds a predetermined value.

8. A battery state-of-charge estimator according to claim 3, wherein the temperature detector unit is placed in the battery, on a surface of the battery, or near the surface of the battery.

9. A battery state-of-charge estimator according to claim 3, wherein at least one of the SOC estimator unit, the second SOC estimator unit, and a third SOC estimator unit periodically estimates the SOC at a predetermined interval.

* * * * *

UNITED STATES PATENT AND TRADEMARK OFFICE
CERTIFICATE OF CORRECTION

PATENT NO. : 7,443,139 B2  
APPLICATION NO. : 10/519573  
DATED : October 28, 2008  
INVENTOR(S) : Masahiko Mitsui et al.

Page 1 of 1

It is certified that error appears in the above-identified patent and that said Letters Patent is hereby corrected as shown below:

Title page, item [57]

In the Abstract, line 6:   Change "$m \leq 10$" to --$m < 10$,--.

line 10:   Change "estimation" to --estimated--.

line 22:   After "corrected" insert --.--.

| Column | Line | |
|---|---|---|
| 21 | 29 | Change "resistance R" to --resistance $R_n$--. |
| 23 | 17 | Change "-120 A ~ 120 A" to -- -120 A – 120 A--. |
| 23 | 62 | Change "estimated, and" to --estimated; and--. |
| 25 | 6 | After "consideration" delete "of". |

Signed and Sealed this

Twenty-third Day of June, 2009

JOHN DOLL  
*Acting Director of the United States Patent and Trademark Office*